(12) United States Patent
Kubo

(10) Patent No.: US 9,887,279 B2
(45) Date of Patent: Feb. 6, 2018

(54) SEMICONDUCTOR DEVICE AND INVERTER INCLUDING THE SEMICONDUCTOR DEVICE

(71) Applicant: ROHM CO., LTD., Kyoto (JP)

(72) Inventor: Yusuke Kubo, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/264,069

(22) Filed: Sep. 13, 2016

(65) Prior Publication Data

US 2017/0077272 A1 Mar. 16, 2017

(30) Foreign Application Priority Data

Sep. 15, 2015 (JP) ................................. 2015-182131

(51) Int. Cl.
*H01L 29/10* (2006.01)
*H01L 29/739* (2006.01)
*H01L 23/31* (2006.01)
*H01L 23/00* (2006.01)
*H02P 27/08* (2006.01)
*H02M 7/5387* (2007.01)
*H02M 1/00* (2006.01)

(52) U.S. Cl.
CPC ...... *H01L 29/7393* (2013.01); *H01L 23/3107* (2013.01); *H01L 24/09* (2013.01); *H01L 29/1095* (2013.01); *H02M 7/5387* (2013.01); *H02M 7/53875* (2013.01); *H02P 27/08* (2013.01); *H01L 2224/04042* (2013.01); *H02M 2001/0048* (2013.01); *Y02B 70/1491* (2013.01)

(58) Field of Classification Search
CPC ..................................................... H01L 29/10

USPC .................................. 257/213, 242, 329, 341
See application file for complete search history.

(56) References Cited

U.S. PATENT DOCUMENTS

| | | | | |
|---|---|---|---|---|
| 5,828,101 A | * | 10/1998 | Endo | ..................... H01L 27/088 257/330 |
| 5,923,051 A | * | 7/1999 | Harris | ............... H01L 29/66068 257/133 |
| 6,238,980 B1 | * | 5/2001 | Ueno | ................ H01L 29/66068 257/E21.066 |
| 6,266,629 B1 | * | 7/2001 | Mallavarpu | ......... G06F 17/5036 703/13 |

(Continued)

FOREIGN PATENT DOCUMENTS

WO WO-2010-024433 A1 3/2010

*Primary Examiner* — Bentsu Ro
(74) *Attorney, Agent, or Firm* — Rabin & Berdo, P.C.

(57) ABSTRACT

A semiconductor device includes a conductivity type drain layer, a conductivity type drift layer, conductivity type base regions located in an upper surface of the drift layer, a conductivity type source region which is disposed inside each of the base regions and is spaced apart from the periphery of the base region, and a channel region is formed between the source region and the periphery of the base region. The semiconductor device further includes a gate insulating layer covering the channel region, a gate electrode which is located on the gate insulating layer and faces the channel region, a plurality of conductivity type column regions, each extends from the plurality of base regions to the drain layer in the drift layer, a trap level forming region in the drift layer, a drain electrode electrically connected to the drain layer, and a source electrode electrically connected to the source region.

14 Claims, 23 Drawing Sheets

(56) References Cited

U.S. PATENT DOCUMENTS

| | | | |
|---|---|---|---|
| 6,551,909 B1 * | 4/2003 | Fujihira | H01L 29/0619 257/E21.383 |
| 7,193,293 B2 * | 3/2007 | Weber | H01L 21/26506 257/329 |
| 2011/0147829 A1 | 6/2011 | Nakajima | |

* cited by examiner

SEMICONDUCTOR DEVICE AND INVERTER INCLUDING THE SEMICONDUCTOR DEVICE

CROSS-REFERENCE TO RELATED APPLICATION

This application is based upon and claims the benefit of priority from Japanese Patent Application No. 2015-182131, filed on Sep. 15, 2015, the entire contents of which are incorporated herein by reference.

TECHNICAL FIELD

The present disclosure relates to a semiconductor device and an inverter including the semiconductor device. The present disclosure also relates to a semiconductor package including a semiconductor device, and an electronic apparatus including an inverter.

BACKGROUND

Conventionally, in an inverter circuit for driving a motor, an insulated gate bipolar transistor (IGBT) has been widely used as a switching element. The IGBT has the characteristic in which an on-resistance is lowered by conductivity modulation of injected electrons and holes and accordingly has an advantage of a small loss in a high voltage/high current operation. However, in the IGBT, since both of electrons and holes contribute to conduction, there are a problem that the IGBT is unsuitable for fast switching due to a tail current generated when a switching element is turned off, and another problem of a large loss in a low voltage/low current operation.

In recent years, in equipment such as an air conditioner with a motor as a load, in order to increase an annual performance factor (APF), there has been a strong demand for reduction in loss which occurs not only in a high power load operation such as a start-up or the like but also in a low power load operation in the stationary conditions. For the purpose of meeting such a demand, it has been examined that a metal oxide semiconductor field effect transistor (MOSFET) having a smaller loss in low voltage/constant current than the IGBT is used as a switching element. In particular, an MOSFET having a super junction structure (hereinafter sometimes referred to as an "SJ-MOSFET") can realize a higher breakdown voltage (e.g., a drain-source voltage of 500 volts or higher) with a lower on-resistance than the existing MOSFET, as will be described later. In addition, the SJ-MOSFET is suitable for high frequency switching since it is a unipolar device. Therefore, the SJ-MOSFET is expected to replace a part of an IGBT in an inverter.

However, a conventional SJ-MOSFET has a problem of a large reverse recovery current (hereinafter denoted by "$I_{rr}$") occurring in an internal parasitic diode (body diode), which extends a reverse recovery time (hereinafter denoted by "$T_{rr}$"). This problem causes the convention SJ-MOSFET to be used less in an inverter circuit for driving a motor of an air conditioner, in practice. This is because, in such an inverter for motors, for example, when a reflux diode of a lower arm side switching element constituting each leg (half bridge) of a bridge circuit flows a current in a forward direction in a reflux mode, there is a timing at which an upper arm side switching element is switched from a turn-off state to a turn-off state, and, at that timing, a reverse recovery current $I_{rr}$ occurs in the reflux diode and a short-circuit current flows through the upper and lower arms. When the reverse recovery current $I_{rr}$ is large, a switching loss becomes excessive due to such a short-circuit current. Therefore, in the conventional SJ-MOSFET, the body diode with the large reverse recovery current $I_{rr}$ cannot be used as the reflux diode and there is a need to connect a fast recovery diode (FRD) element functioning as the reflux diode in parallel between drain and source.

For the purpose of overcoming this problem, there has been proposed an SJ-MOSFET which is capable of significantly reducing a reverse recovery current $I_{rr}$ by forming a local trap level in a semiconductor and controlling lifetime of minor carriers.

However, in a case where such an SJ-MOSFET is used in an inverter for motors, when the SJ-MOSFET has a miniaturized structure, it has been found that there may occur a "self-turn-on" effect, i.e., "shooting-through," in which the SJ-MOSFET, which should be originally in a turn-off state, is conducting with no intention.

SUMMARY

The present disclosure provides some embodiments of a semiconductor device which is capable of preventing a self-turn-on effect from occurring even when the semiconductor device is used in an inverter driving an inductive load such as a motor or the like, and an inverter including the same.

According to one embodiment of the present disclosure, there is provided a semiconductor device including: a first conductivity type drain layer; a first conductivity type drift layer on the first conductivity type drain layer; a plurality of second conductivity type base regions located in an upper surface of the drift layer; a first conductivity type source region which is disposed inside each of the plurality of base regions and is spaced apart from the periphery of the base region, wherein a channel region is formed between the source region and the periphery of the base region; a gate insulating layer covering the channel region; a gate electrode which is located on the gate insulating layer and faces the channel region; a plurality of second conductivity type column regions, each extending from the plurality of base regions to the drain layer in the drift layer; a trap level forming region in the drift layer; a drain electrode electrically connected to the drain layer; and a source electrode electrically connected to the source region; wherein, when a drain-source voltage is $V_{DS}$, a gate-source capacitance is $C_{gs}$, and a gate-drain capacitance is $C_{gd}$, a value of $(C_{gs}+C_{gd})/C_{gd}$ at $V_{DS}$ of 5 volts is equal to or more than 4 and equal to or less than 30.

In one embodiment, the semiconductor device further includes: a first conductivity type impurity additional doping layer located in the upper surface of the drift layer.

In one embodiment, a dose of implantation of first conductivity type impurity ions in the impurity additional doping layer is equal to or more than $1.0 \times 10^{12}/cm^2$ and equal to or less than $2.0 \times 10^{12}/cm^2$.

In one embodiment, the minimum dimension of the gate electrode is equal to or more than 8 μm and equal to or less than 10 μm.

In one embodiment, a space between two adjacent base regions in the upper surface of the drift layer is equal to or more than 1 μm and equal to or less than 2 μm.

In one embodiment, $(C_{gs}+C_{gd})/C_{gd}$ at $V_{DS}$ of 5 volts is equal to or more than 5 and equal to or less than 30.

In one embodiment, reverse recovery time of a body diode is equal to or less than 150 nano seconds.

In one embodiment, the plurality of base regions and the plurality of column regions are arranged in a stripe shape.

In one embodiment, the semiconductor device further includes: an interlayer insulating film which electrically isolates the gate electrode and the source electrode from each other and has an opening which contacts the source electrode to each of the plurality of source regions; a first pad electrode disposed on the interlayer insulating film and electrically connected to the gate electrode; and a second pad electrode electrically connected to the source electrode.

According to another embodiment of the present disclosure, there is provided a semiconductor package including: one or more semiconductor chips; a resin molding body containing the semiconductor chips, wherein at least one of the one or more semiconductor chips is the above-described semiconductor device, the semiconductor package further including: a first lead electrically connected to the first pad electrode; a second lead electrically connected to the second pad electrode; and a die bonding pad electrically connected to the drain electrode and having one end from which a third lead extends, wherein a portion of each of the first, second and third leads projects from the resin molding body.

In one embodiment, the first pad electrode and the second pad electrode are connected to the first lead and the second lead by wire bonding, respectively, and the drain electrode is connected to the die bonding pad by a conductive adhesive layer.

According to another embodiment of the present disclosure, there is provided an inverter including: a bridge circuit formed by a plurality of switching elements, each containing a body diode; and a gate drive circuit configured to drive the plurality of switching elements, wherein each of the plurality of switching elements is the above-described semiconductor device.

In one embodiment, one of the source electrode and the drain electrode of the semiconductor device is connected to an inductive load.

According to another embodiment of the present disclosure, there is provided an electronic apparatus including: an inverter including a bridge circuit formed by a plurality of switching elements, each containing a body diode; and a motor connected to the inverter, wherein at least one of the plurality of switching elements is the above-described semiconductor device.

DETAILED DESCRIPTION

Prior to description on embodiments of the present disclosure, characteristics required for an MOSFET used in an inverter and an example of self-turn-on operation will be first described. The term "inverter" used herein refers to a device with an inverter circuit and may include other circuits, such as an AC-DC converter and/or a DC-DC converter, and the like, at the previous stage of the inverter circuit.

Figure 1A:
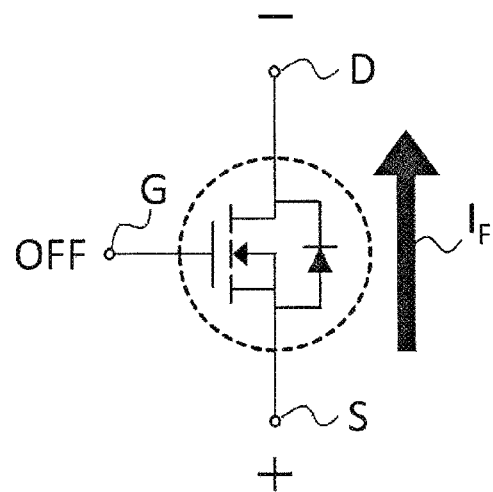
FIG. 1A is a circuit diagram showing an N-channel enhancement type MOSFET and its body diode (in a state where a forward voltage is applied).
Figure 1B:
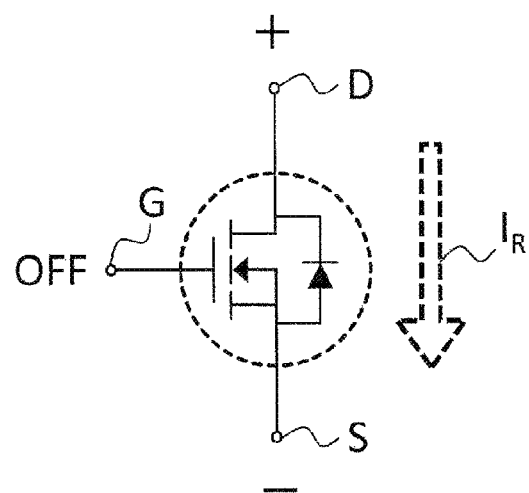
FIG. 1B is a circuit diagram showing an N-channel enhancement type MOSFET and its body diode (in a state where a reverse voltage is applied).

First refer to FIGS. 1A and 1B. These figures illustrate an N-channel enhancement type MOSFET and its body diode (parasitic diode). A gate terminal G of the MOSFET is given with a potential holding the MOSFET in a turn-off state, that is, a potential lower than a threshold $V_{GS}(th)$ of the MOSFET.

As shown in FIG. 1A, when the potential of a drain terminal D of the MOSFET is negative (−) with respect to the potential of a source terminal S thereof, that is, when a drain-source voltage $V_{DS}$ is negative (−), a forward voltage is applied to the body diode. At this time, as indicated by a black arrow, a forward current $I_F$ flows in the body diode from the source terminal S toward the drain terminal D.

As shown in FIG. 1B, when the drain-source voltage $V_{DS}$ is positive (+), a reverse voltage (reverse bias voltage) is applied to the body diode. At this time, in the steady state, no current flows through the body diode. That is, a reverse current $I_R$ indicated by a white dotted arrow is ideally zero.

However, at a timing of transition from the voltage application state of FIG. 1A to the voltage application state of FIG. 1B, the reverse current $I_R$ flows only during a short period of time immediately after the timing. This is because carriers (electrons and holes) are accumulated in the body diode while the forward current is flowing through the body diode in the voltage application state of FIG. 1A, and the accumulated carriers form the reverse current $I_R$ transiently at the time of transition to the voltage application state of FIG. 1B. In particular, holes, which are minor carriers of an n-type semiconductor region, have lower mobility than electrons, which causes the increase the time for which the reverse current $I_R$ flows.

Figure 2:
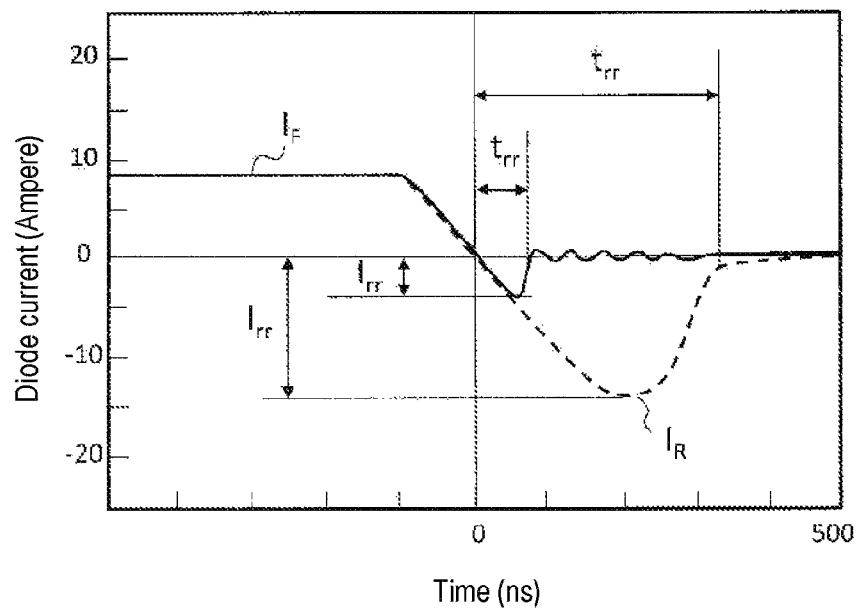
FIG. 2 is a graph schematically showing one example of a temporal change of a current flowing through a body diode when a reverse voltage is applied to the body diode through which a forward current $I_F$ is flowing.

FIG. 2 is a graph showing one example of a temporal change of a current flowing through a body diode when a reverse voltage is applied to the body diode through which a forward current $I_F$ is flowing. In the graph, a horizontal axis represents time and a vertical axis represents a current. At time 0, the direction of current flow is reversed. A current flowing through the body diode is defined to have a "positive" value when the current flows from the source terminal S to the drain terminal D and a "negative" value when the current flows from the drain terminal D to the source terminal S. Accordingly, the reverse current $I_R$ has a negative value.

A broken line in FIG. 2 shows an example of a waveform of a current flowing through a body diode of a typical SJ-MOSFET in which no lifetime control of minor carriers is performed. When the reverse voltage is applied, the forward current $I_F$ decreases with a slope of $dI_F/dt$ and becomes zero at time 0 and the reverse current $I_R$ flows out. After reaching the maximum value, the absolute value of the reverse current $I_R$ rapidly decreases and converges to zero. The maximum of the absolute value of the reverse current $I_R$ is defined as a "reverse recovery current $I_{rr}$." The time taken until the absolute value of the reverse current $I_R$ is reduced to 10% of the "reverse recovery current $I_{rr}$" after the reverse current $I_R$ flows out is defined as "reverse recovery time $t_{rr}$." The typical SJ-MOSFET has relatively long reverse recovery time $t_{rr}$ since the area of a pn junction surface is increased due to a super junction structure, as will be described later.

A solid line in FIG. 2 shows an example of a waveform of a current flowing through a body diode of an SJ-MOSFET in which a lifetime control of minor carriers is performed. In this SJ-MOSFET, since a trap level (lifetime killer) to control the lifetime is formed in a proper portion in semiconductor crystals, carriers accumulated while the forward current $I_F$ is flowing are lost in a short time after the reverse voltage is applied, thereby shortening the reverse recovery time $t_{rr}$.

Figure 3:
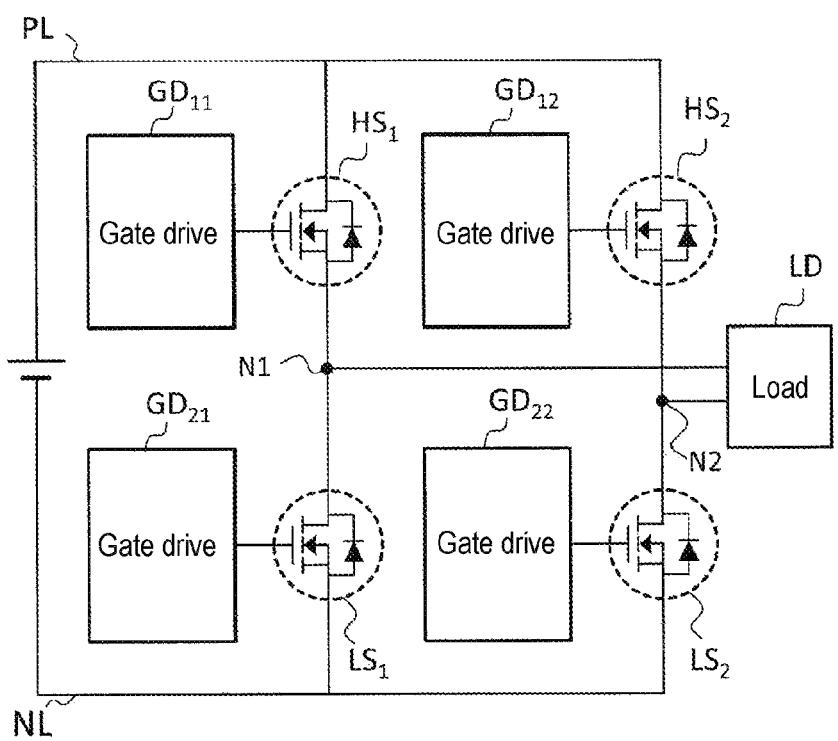
FIG. 3 is a circuit diagram showing one example of a single phase inverter.
Figure 4A:
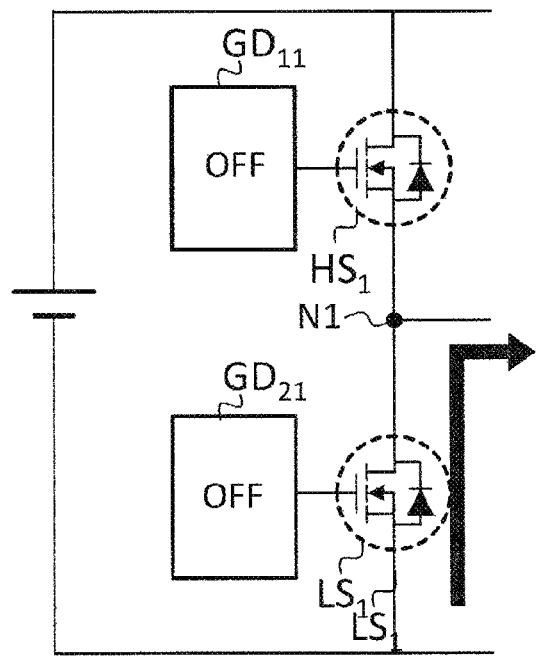
FIG. 4A is a circuit diagram showing a path of current flowing through one of two legs (half bridge) forming a bridge circuit in the inverter of FIG. 3.
Figure 4B:
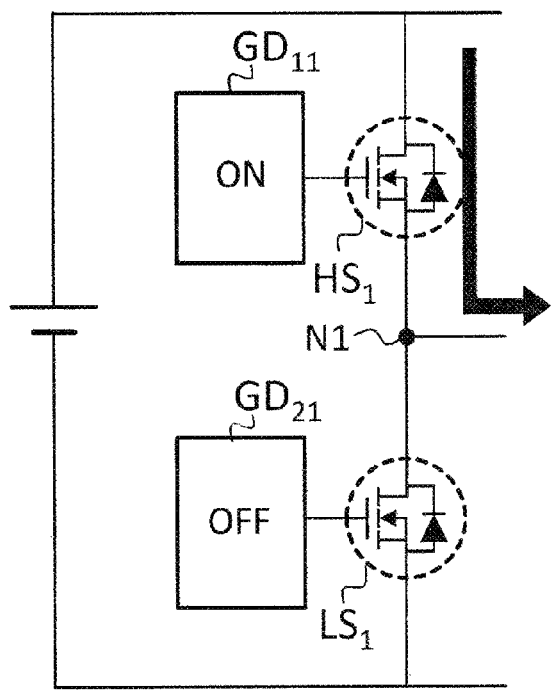
FIG. 4B is a circuit diagram showing another path of current flowing through one of two legs (half bridge) forming a bridge circuit in the inverter of FIG. 3.
Figure 5:
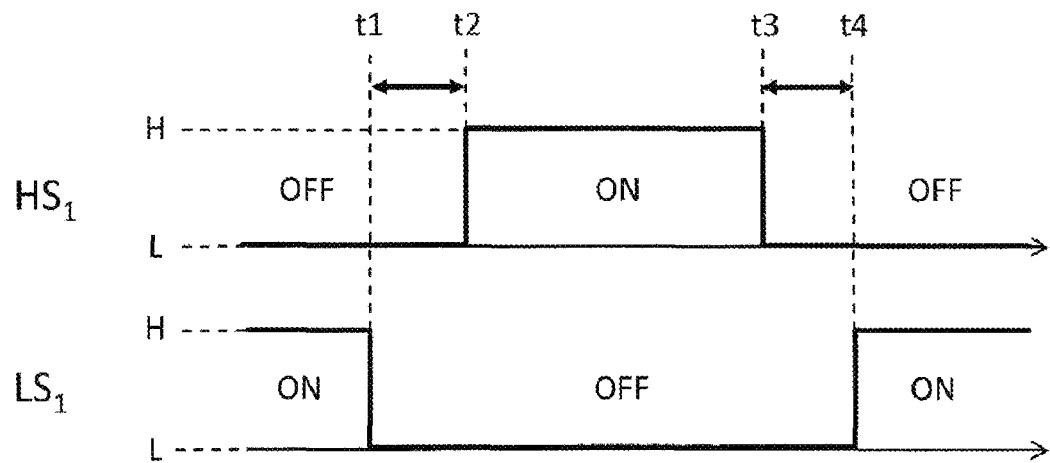
FIG. 5 is a waveform diagram showing one example of a signal applied to each gate electrode of a high side switching element $HS_1$ and a low side switching element $LS_1$.
Figure 6:
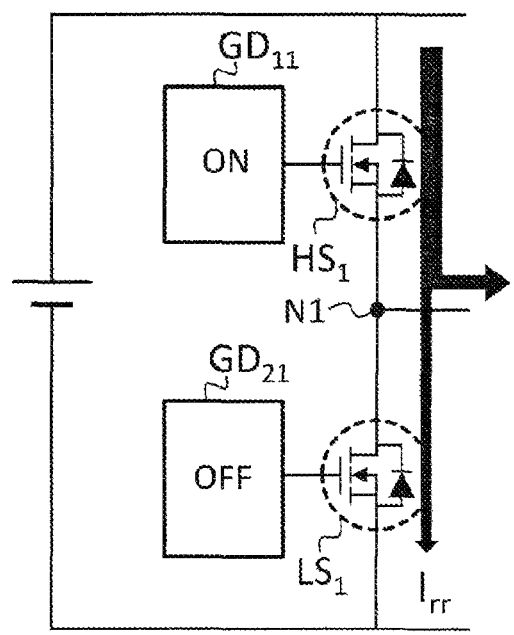
FIG. 6 is a view showing a state where a reverse recovery current $I_{rr}$ of a body diode flows through the switching elements $HS_1$ and $LS_1$.

Next, refer to FIGS. 3 to 6. FIG. 3 is a circuit diagram showing one example of a single phase inverter. FIGS. 4A, 4B and 6 are circuit diagrams showing one of two legs (half bridge consisting of upper and lower arms) forming a bridge circuit in the inverter of FIG. 3. A difference between FIGS. 4A, 4B and 6 lies in a flow of current. FIG. 5 is a waveform diagram showing one example of a drive signal.

The single phase inverter of FIG. 3 is one example of a non-limitative illustrative inverter and includes two legs interposed between a DC bus PL connected to a positive electrode of a DC power supply and a DC bus NL connected to a negative electrode of the DC power supply. The first leg includes a high side switching element $HS_1$ and a low side switching element $LS_1$, and the second leg includes a high side switching element $HS_2$ and a low side switching element $LS_2$. Each of these switching elements is an SJ-MOSFET subjected to a lifetime control of minor carriers and contains a body diode. Therefore, a high side switching element may be referred to as a "high side MOSFET" and a low side switching element may be referred to as a "low side MOSFET." A "high side" can be referred to as an "upper arm" and a "low side" can be referred to as a "lower arm."

In the inverter illustrated in FIG. 3, the four switching elements form a bridge circuit to convert DC power into single phase AC power. A node N1 and a node N2 in the bridge circuit are connected to an inductive load LD such as a motor or the like. An inverter to which a semiconductor device according to the present disclosure can be applied is not limited to such a single phase inverter but may be one that converts DC power into AC power of three or more phases. In addition, a DC power supply may include an AC-DC converter for converting AC power into DC power and/or a DC-DC converter for converting DC power into DC power having a different voltage.

In the example of FIG. 3, gate drive circuits $GD_{11}$, $GD_{12}$, $GD_{21}$ and $GD_{22}$ are connected to gate terminals of the switching elements $HS_1$, $HS_2$, $LS_1$ and $LS_2$, respectively. These gate drive circuits $GD_{11}$, $GD_{12}$, $GD_{21}$ and $GD_{22}$ may be integrated into a single integrated circuit (IC) chip acting as a gate driver. A control signal is applied from a control circuit (not shown) such as a microcomputer or the like to the gate drive circuits $GD_{11}$, $GD_{12}$, $GD_{21}$ and $GD_{22}$. This control signal is typically a pulse width modulation (PWM) signal. The gate drive circuits $GD_{11}$, $GD_{12}$, $GD_{21}$ and $GD_{22}$ may change voltages of the gate terminals of the respective switching elements $HS_1$, $HS_2$, $LS_1$ and $LS_2$ according to the control signal. Thus, the switching elements $HS_1$, $HS_2$, $LS_1$ and $LS_2$ perform a turn-on or turn-off switching operation.

Next, a current flowing through the high side switching element $HS_1$ and the low side switching element $LS_1$ constituting one leg (half bridge) will be described with reference to FIGS. 4A and 4B.

A signal (gate drive pulse) as shown in FIG. 5 is applied to each of the gate terminals of the high side switching element $HS_1$ and the low side switching element $LS_1$. As a result, the high side switching element $HS_1$ and the low side switching element $LS_1$ are alternately turned on. The turn-on and turn-off of the switching elements $HS_1$ and $LS_1$ does not necessarily instantaneously take place but proceeds with a delay time due to charging/discharging of a parasitic capacitance. During a period of time in which the switching elements $HS_1$ and $LS_1$ are simultaneously turned on, an excessive current flows through one leg. In order to prevent such a through current from occurring, dead time intervals t to t2 and t3 to t4 are interposed between the turn-on state of the switching element $HS_1$ and the turn-on state of the switching element $LS_1$ such that the switching elements $HS_1$ and $LS_1$ are not simultaneously turned on. Both of the high side switching element $HS_1$ and the low side switching element $LS_1$ remain turned off during the dead time intervals. The same operation is performed for the switching elements $HS_2$ and $LS_2$. This is not limited to a single phase inverter circuit may be equally applied to a three phase inverter circuit.

FIG. 4A shows that both of the switching elements $HS_1$ and $LS_1$ remain turned off. This corresponds to a state of the dead time interval t1 to t2 shown in FIG. 5. In this case, it is assumed that the body diode is conducting in the low side switching element $LS_1$ due to a large inductance of the load LD shown in FIG. 3. Such an operation mode may occur in any inverter used for driving a motor. In this state, when the switching element $HS_1$ is turned on at time t2 in FIG. 5, since the potential at the node N1 rises, a reverse bias voltage is applied to the body diode of the low side switching element $LS_1$. As a result, as shown in FIG. 6, a reverse recovery current $I_{rr}$ of the body diode flows through the switching elements $HS_1$ and $LS_1$. Such a through current is likely to lower efficiency of the inverter and damage the switching element $HS_1$. Therefore, it is desirable to suppress and prevent the through current as much as possible. In the typical SJ-MOSFET, this problem can be solved by forming a trap level (lifetime killer) to control the lifetime in a proper portion in semiconductor crystals, although the reverse recovery current $I_{rr}$ is large and the reverse recovery time $t_{rr}$ is relatively long.

However, studies made by the present inventors have revealed that, even when an inverter is constituted by an SJ-MOSFET with a reverse recovery current $I_{rr}$ reduced by a trap level in a semiconductor crystal, there may occur an event (shooting-through) where a current flows through the switching elements in the same legs (half bridge) due to a self-turn-on effect. The present inventors have carefully studied on a device structure to suppress and prevent such a self-turn-on effect and have found that an SJ-MOSFET designed based on an indicator measured under specific conditions can overcome the above problems. The present disclosure was made based on such findings. Since the above problems can be overcome based on a structure of a semiconductor device, the present disclosure has advantages that there is no need to provide a special circuit for preventing a self-turn-on effect and there is no limitation in a degree of freedom in design for peripheral circuits of the semiconductor device.

Next, a relationship between a self-turn-on effect and a parasitic capacitance of an SJ-MOSFET will be described.

Figure 7:
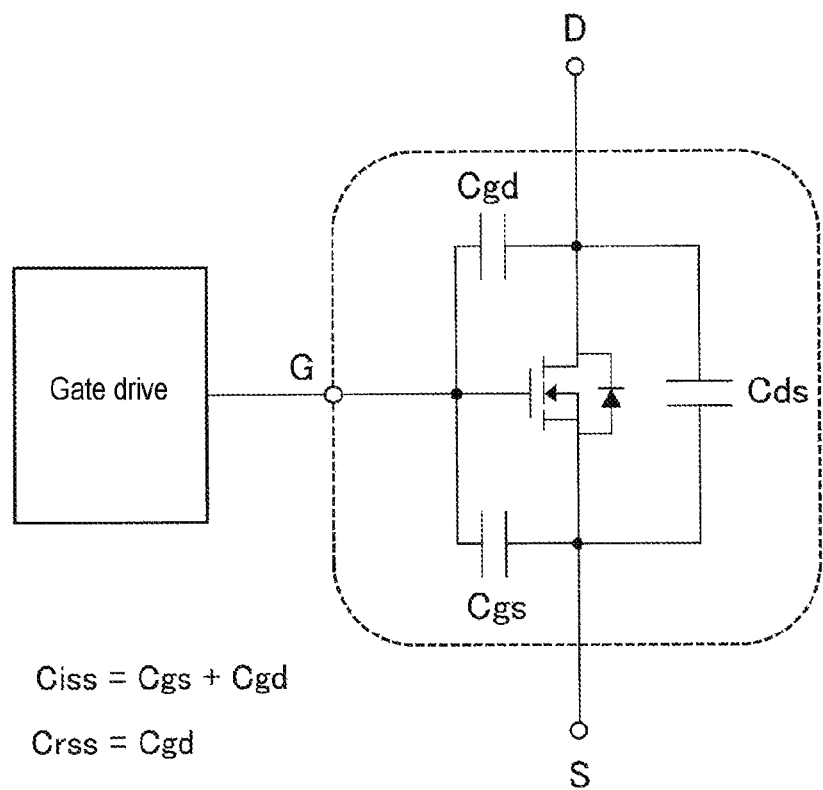
FIG. 7 is an equivalent circuit diagram showing a parasitic capacitance of an SJ-MOSFET.

First, a parasitic capacitance of an SJ-MOSFET will be described with reference to FIG. 7. FIG. 7 is an equivalent circuit diagram showing a typical parasitic capacitance of an SJ-MOSFET.

A gate-source capacitance is formed between a gate electrode G and a source electrode S of the SJ-MOSFET, and a gate-drain capacitance is formed between the gate electrode G and a drain electrode D of the SJ-MOSFET. In the following description, the gate-source capacitance is denoted by $C_{gs}$ and the gate-drain capacitance is denoted by $C_{gd}$. As will be described later, these capacitances $C_{gs}$ and $C_{gd}$ are varied depending on a drain-source $V_{DS}$ which corresponds to a potential of the drain electrode D relative to a potential of the source electrode. More specifically, $C_{gs}$ has a low dependency on $V_{DS}$, whereas $C_{gd}$ has a high dependency on $V_{DS}$. $C_{gs}+C_{gd}$ is called "input capacitance" and is expressed as $C_{iss}$. $C_{gd}$ is called "feedback capacitance" and may be expressed as $C_{rss}$. For reference, a drain-source capacitance $C_{ds}$ formed between the drain D and the source electrode S is also shown in FIG. 7.

In general, when the potential of the drain electrode D is steeply varied, since a displacement current flows into the gate electrode G via the gate-drain capacitance $C_{gd}$, the potential of the gate electrode G may rise temporarily. When the potential of the gate electrode G rises in this manner and exceeds a threshold value $V_{GS}(th)$ of the MOSFET, a self-turn-on effect occurs and the transistor is turned on.

In an embodiment of the semiconductor device of the present disclosure, in order to suppress or prevent the self-turn-on effect, a ratio of input capacitance $C_{iss}$ to feedback capacitance $C_{rss}$ for a specific value of $V_{DS}$, i.e., $C_{iss}/C_{rss}=(C_{gs}+C_{gd})/C_{gd}$, is adjusted to fall within a predetermined range.

In consideration of a self-turn-on mechanism, the feedback capacitance $C_{rss}$, i.e., the gate-drain capacitance $C_{gd}$, is advantageously as small as possible and, as a result, $C_{iss}/C_{rss}$ is desirably as large as possible. However, an MOSFET with improved element performance, particularly, an SJ-MOSFET with the reduced on-resistance and the increased switching speed, has a tendency to decrease $C_{iss}/C_{rss}$ and has a difficulty in preventing the self-turn-on effect. The present inventors have found that, in an SJ-MOSFET with reduced reverse recovery current $I_{rr}$ of a body diode, $C_{iss}/C_{rss}$ obtained when $V_{DS}$ is close to a threshold voltage (e.g., $V_{GS}(th)=4$ volts) of the MOSFET has an important effect on the self-turn-on effect, and have made the present invention based on such findings.

In the semiconductor device according to the present disclosure, an SJ-MOSFET is designed such that $C_{iss}/C_{rss}$ at $V_{DS}$ of 5 volts falls within a range of 4 to 30. In particular, $C_{iss}/C_{rss}$ is advantageously 5 or more. With this configuration, it is possible to reduce on-resistance and suitably prevent a self-turn-on effect without sacrificing a switching speed.

Hereinafter, non-limitative and illustrative embodiments of the semiconductor device according to the present disclosure will be described. However, more details than necessary may be omitted. For example, detailed explanation on known matters may be omitted and explanation on substantially the same elements and configurations will not be repeated. This is to avoid the following description from being unnecessarily redundant and facilitate the understandings of the present disclosure by those skilled in the art. In addition, the accompanying drawings and the following description are just be provided to make the present disclosure fully understood by those skilled in the art but are not intended to limit the subject matter defined in the claims. The orientation of structures shown in the drawings of the present application is set in consideration of the simplicity of the description and is not intended to limit an orientation when embodiments of the present disclosure are practiced in reality. The shape, size and proportion of all or some of structures shown in the drawings are not intended to limit the shape, size and proportion in practice.

Embodiments

<General Configuration of SJ-MOSFET>

Figure 8:
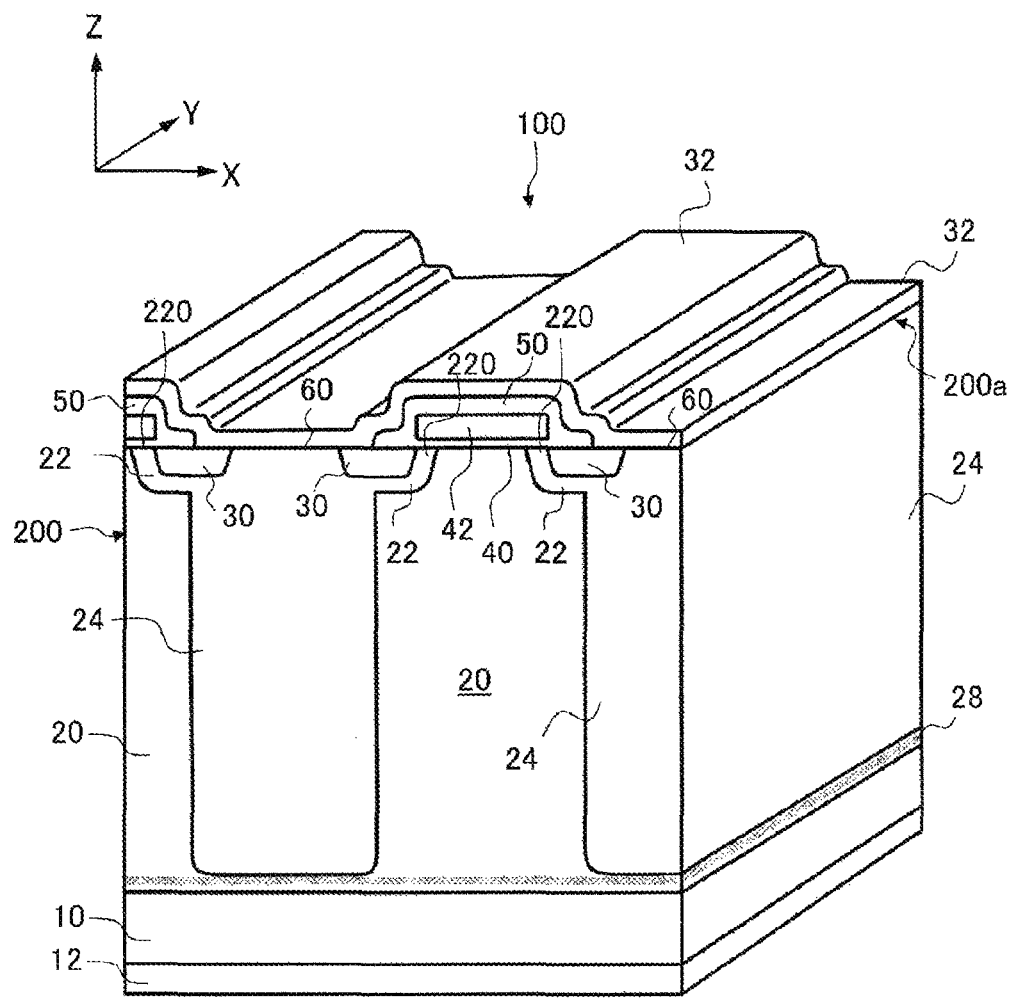
FIG. 8 is a perspective view schematically showing a portion of a semiconductor device 100 according to an embodiment.

First, one example of the basic configuration of a semiconductor device according to an embodiment will be described with reference to FIG. 8. FIG. 8 is a perspective view schematically showing a portion of a semiconductor device 100 according to an embodiment. For reference, an XYZ coordinate system having an X-axis, a Y-axis and a Z-axis which are orthogonal to each other is shown in FIG. 8. The structure shown in FIG. 8 is a structure obtained by cutting out only a part of the semiconductor device 100 extending along the X-axis direction and the Y-axis direction, but does not show the entire semiconductor device 100.

The semiconductor device 100 as shown is an n-channel type MOSFET having a super junction structure (SJ-MOSFET). The semiconductor device 100 includes an $n^+$ type drain layer 10, an $n^-$ type drift layer 20 formed on the $n^+$ type drain layer 10, a plurality of p-type base regions 22 located on the upper surface of the $n^-$ type drift layer 20 (a surface with its normal facing the positive direction of the Z-axis, among surfaces parallel to the XY plane), and an $n^+$ type source region 30 arranged inside each of the plurality of p-type base regions 22 and spaced apart from the periphery of the p-type base region 22. In the example shown in FIG. 8, all of the p-type base regions 22 and $n^+$ type source regions 30 extend in a stripe shape along the Y-axis direction. Channel regions 220 are formed between the $n^+$ type source regions 30 and the peripheries of the p-type base regions 22. As described above, the orientation of the semiconductor device 100 is optional in use and the term "upper surface" is not intended to define the actual vertical relationship.

In the present specification, an "n-type" of semiconductor means that a majority of carriers in the semiconductor are fee electrons. For example, when the semiconductor is formed from tetravalent silicon, an n-type semiconductor is doped with phosphorus (P), arsenic (As) and/or antimony (Sb), which are pentavalent elements, as impurities. These impurities act as donor ions. In some cases, a relative high concentration (doping level) of n-type impurities may be denoted by "$n^+$ type" and a relative low concentration of n-type impurities tray be denoted by "$n^-$ type." A "p-type" of semiconductor means that a majority of carriers in the semiconductor are holes. For example, when the semiconductor is formed from tetravalent silicon, a p-type semiconductor is doped with boron (B), aluminum (Al) and/or gallium (Ga), which are trivalent elements, as impurities. These impurities act as acceptor ions. In some cases, a relative high concentration (doping level) of p-type impurities may be denoted by "$p^+$ type" and a relative low concentration of p-type impurities may be denoted by "$p^-$ type."

Both of n-type impurities and p-type impurities may be doped in the same region of the semiconductor. A conductivity type (n-type or p-type) of the corresponding region is determined by activated impurities of a higher concentration of the n-type impurities and the p-type impurities. When one of n-type and p-type is called "first conductivity type," the other is called "second conductivity type." That is, the terms "first conductivity type" and "second conductivity type" may mean "n-type" and "p-type," respectively. Conversely, the terms "first conductivity type" and "second conductivity type" may mean "p-type" and "n-type," respectively.

In the present specification, the term "layer" is not limited to mean a single continuous film. Each of a plurality of separated structures patterned from a single film may be called "layer." A range of thickness of the "layer" has no particular limitation. A structure, such as a "substrate," which is used to support other layers and has sufficient rigidity and thickness may be called "layer." A single "layer" may be a laminated structure including a plurality of thinner layers.

In this embodiment, the $n^+$ type drain layer 10 may be an $n^+$ type semiconductor substrate (e.g., a single crystalline silicon substrate) or a semiconductor layer supported by another substrate (which can be formed from semiconductor or insulating material). A typical example of the $n^+$ type semiconductor substrate is a single crystalline semiconductor doped with n-type impurities during crystal growth. The semiconductor substrate may be in a wafer state in the course of manufacturing, but it may eventually be segmented from one wafer to a plurality of chips. The semiconductor substrate may be thinner in the course of manufacturing, such as by a polishing process.

The $n^-$ type drift layer 20 is a semiconductor layer doped with n-type impurities, typically, an n-type epitaxial layer formed by epitaxial growth while being doped with n-type impurities. The p-type base region 22 and the $n^+$ type source region 30 are impurity-doped regions formed inside the $n^-$ type drift layer 20. These impurity-doped regions implement a function different from the function of the $n^-$ type drift layer 20, but contain n-type impurities originally contained in the $n^-$ type drift layer 20.

In the above-described configuration, the semiconductor device 100 includes a gate insulating layer 40 extending to cover the entire upper surface (n-type region surface) of the $n^-$ type drift layer 20, a portion of the channel region 220 and a portion of the $n^+$ type source region 30, and a gate electrode 42 located on the gate insulating layer 40. The gate electrode 42 has a planar structure to cover the entire channel region 220. The upper and side surfaces of the gate electrode 42 are covered by an interlayer insulating film 50.

The semiconductor device 100 includes a drain electrode 12 electrically connected to the $n^+$ type drain layer 10, and a source electrode 32 electrically connected to the $n^+$ type source region 30. The source electrode 32 and the gate electrode 42 are electrically isolated from each other by the interlayer insulating film 50. A contact hole 60 is formed in the interlayer insulating film 50. The source electrode 32 makes contact with the p-type base region 22 and the n⁺ type source region 30 via the contact hole 60.

Further, the semiconductor device 100 of this embodiment includes a plurality of p-type column regions 24 extending from the plurality of base regions 22 toward the drain layer 10 in the n⁻ type drift layer 20 in the vertical direction (the Z-axis direction) of the figure, and a trap level forming region 28 formed in the n⁻ type drift layer 20. The p-type column region 24 is an element forming a super junction structure and may be called "pillar." As will be described above, the configuration of the p-type column region 24 is not limited to the configuration illustrated in FIG. 8.

The trap level forming region 28 may be formed, for example by irradiating heavy particles from the rear side of the n⁺ type drain layer 10. Particle species which can be used for irradiation may be one of proton, 3He⁺⁺ and 4He⁺⁺. When irradiating the semiconductor with particles (heavy particles) having larger mass than electrons in this manner, semiconductor crystals are locally damaged and a deep level is accordingly formed. Thus, since the lifetime of carriers is adjusted, the reverse recovery time is shortened in spite of the super junction structure.

In the present specification, the n⁺ type drain layer 10, the n⁻ type drift layer 20 and the various types of impurity-doped regions (the p-type base region 22, the p-type column region 24, the n⁺ type source region 30, etc.) formed in the n⁻ type drift layer 20 may be generally referred to as "semiconductor crystal." The upper surface of the n⁻ type drift layer 20, the upper surface of the p-type base region 22 and the upper surface of the n⁺ type source region 30 are located on the upper surface (the surface parallel to the XY plane) 200a of the semiconductor crystal 200 shown in FIG. 8. Speaking strictly, the n-type region of the n⁻ type drift layer 20 is located outside the p-type base region 22 and the upper surface of the n⁻ type drift layer 20 just occupies a portion of the upper surface 200a of the semiconductor crystal 200. However, in the present specification, the upper surface 200a of the semiconductor crystal 200 is allowed to be simply called "the upper surface of the n⁻ type drift layer 20." Therefore, it may be expressed that the p-type base region 22 and the n⁺ type source region 30 are formed on the upper surface of the n⁻ type drift layer 20. In addition, for the same reason, it may be expressed that the p-type column region 24 extends from the p-type base region 22 in the n⁻ type drift layer 20, etc.

<Detailed Configuration of SJ-MOSFET>

Figure 9A:
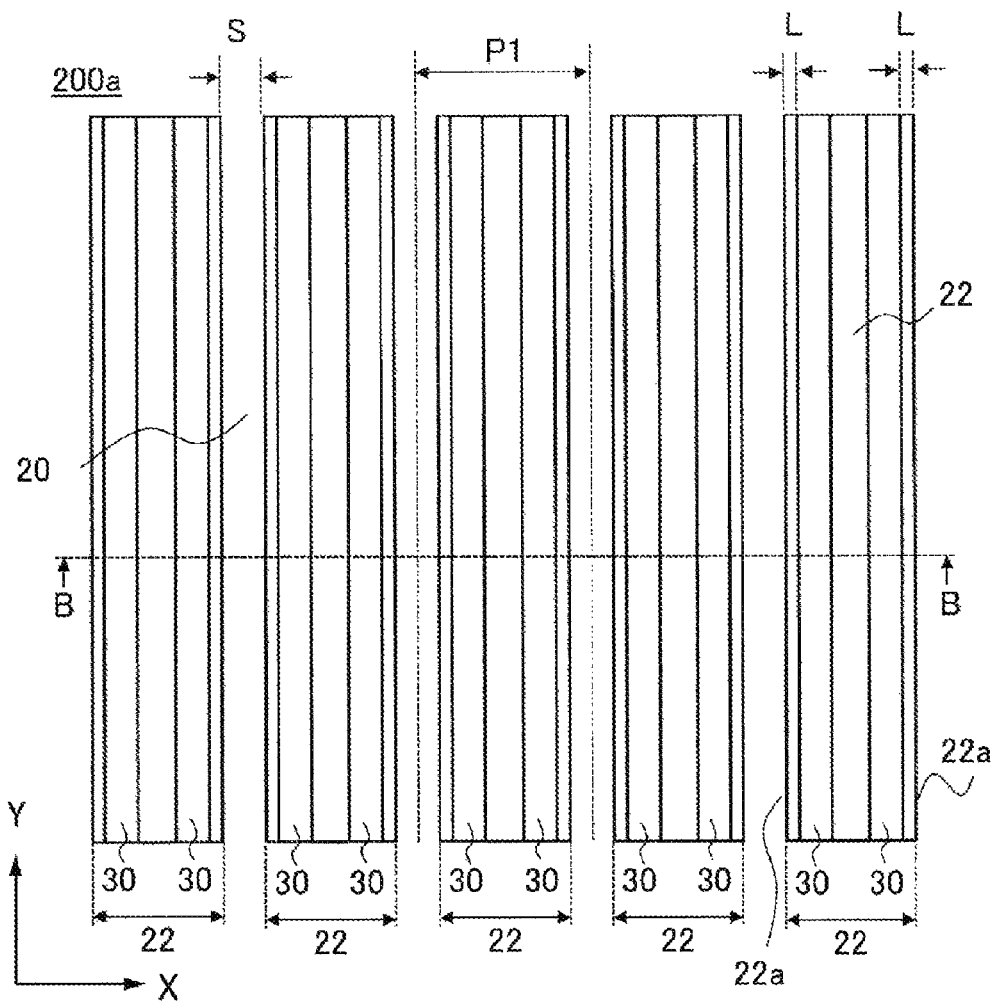
FIG. 9A is a plan view of a portion of the upper surface 200a of a semiconductor crystal 200 when viewed from its normal (Z-axis) direction.
Figure 9B:
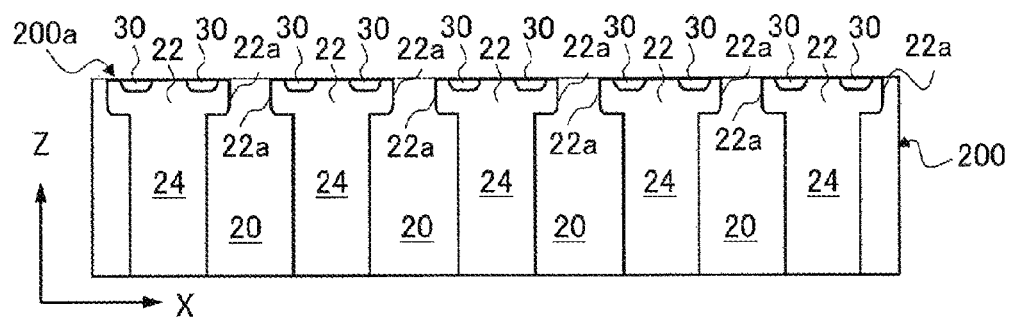
FIG. 9B is a sectional view taken along line B-B in FIG. 9A.
Figure 10:
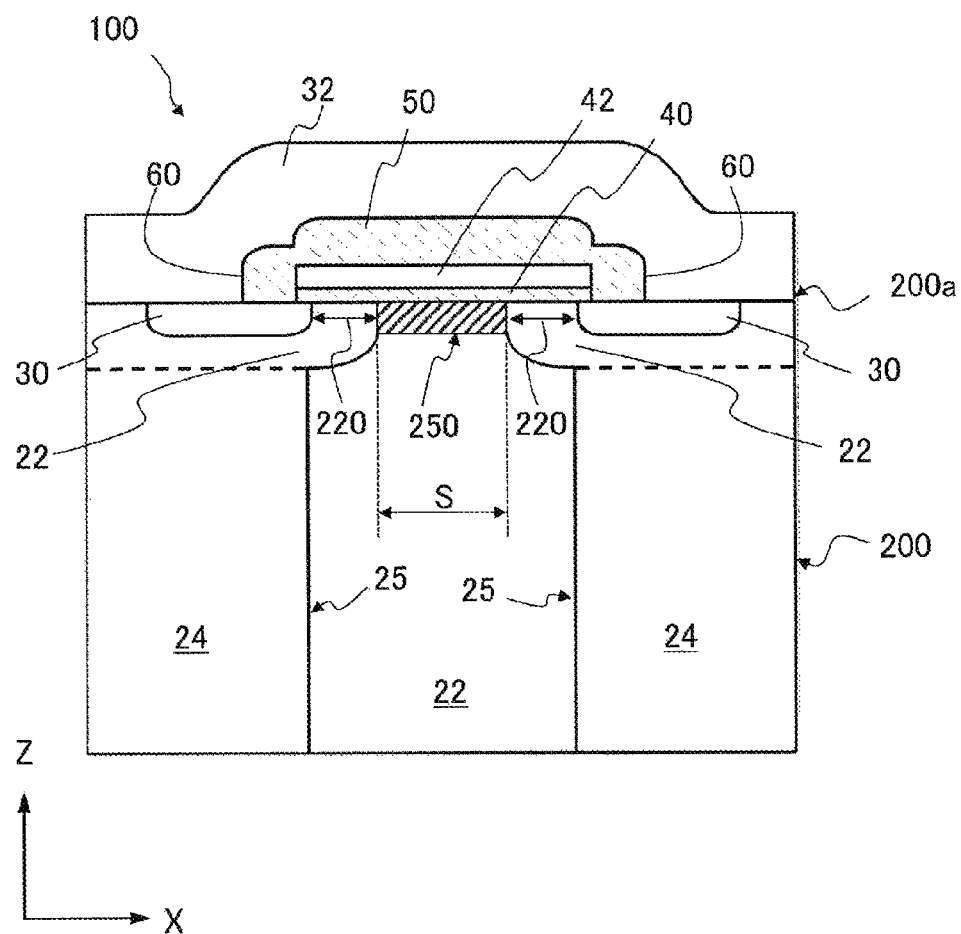
FIG. 10 is a sectional view schematically showing one MOS structure included in the semiconductor device 100 of this embodiment and the peripheral portion thereof.

Next, the configuration example of this embodiment will be described in more detail with reference to FIGS. 9A, 9B and 10. FIG. 9A is a plan view of a portion of the upper surface 200a of the semiconductor crystal 200 when viewed from its normal (Z-axis) direction. FIG. 9B is a sectional view taken along line B-B in FIG. 9A. For the purpose of simplification, in FIGS. 9A and 9B, only the upper half portion of the semiconductor crystal 200 is shown, but portions (the n⁺ type drain layer 10, the drain electrode 12, the source electrode 32, the gate electrode 42, etc.) other than the upper half portion of the semiconductor crystal 200 is not shown. FIG. 10 is a sectional view schematically showing one MOS structure included in the semiconductor device 100 of this embodiment and the peripheral portion thereof. In reality, the semiconductor device 100 has a configuration of a periodical arrangement of identical MOS structures.

As shown in FIG. 9A, a plurality of p-type base regions 22 is discretely arranged in the upper surface 200a of the semiconductor crystal 200. In this example, the plurality of p-type base regions 22 has a stripe shape extending in parallel along the Y-axis direction. A space (in the X-axis direction) between two adjacent p-type base regions 22 is denoted by a symbol "S" in FIG. 9A. The space S is defined by the peripheries 22a of the adjacent p-type base regions 22 and the upper surface of the n⁻ type drift layer 20 is located in the space S. The width (size in the X-axis) of each of the p-type base regions 22 may be set to, e.g., 3 μm to 10 μm. In this example, the semiconductor device 100 includes a plurality of cells (the unit of the periodical structure) arranged in a stripe shape, each of which contains one p-type base region 22. A symbol "P1" in FIG. 9A denotes the width (size in the X-axis direction) of one cell and the width P1 corresponds to an arrangement pitch of cells (a cell pitch). Although five cells are shown in FIG. 9A, in reality, the semiconductor device 100 may include more than a few thousands of cells.

A plurality of p-type column regions 24 is arranged in a stripe shape, extending in the vertical (Z-axis) direction from the central portion of the corresponding p-type base region 22 toward the n⁺ type drain layer 10. The size of the p-type column region 24 in the Z-axis direction is, e.g., 15 μm to 50 μm. Although not shown in FIG. 9B, a distance from the bottom of the p-type column region 24 to the n⁺ type drain layer 10 may be set to, e.g., 5 μm or more. The pitch of the p-type column regions 24 arranged in the stripe shape is 5 μm to 20 μm. In this embodiment, the arrangement pitch of the p-type column regions 24 is equal to the arrangement pitch (P1) of the cells. The p-type column region 24 defines a p-type semiconductor region that is continuous in conjunction with the p-type base region 22 and a super junction structure is formed between the p-type column region 24 and the n⁻ type drift layer 20.

The n⁺ type source region 30 is located in a selected region inside the p-type base region 22 in the plan view of FIG. 9A. This n⁺ type source region 30 is also formed in a stripe shape along the Y-axis direction. The n⁺ type source region 30 is also formed, for example by injecting n-type impurity ions into the selected region of the p-type base region 22. More specifically, the n⁺ type source region 30 is separated inward by a predetermined distance from the periphery 22a of the p-type base region 22. As shown in FIG. 9A, this predetermined distance corresponds to the size L in the X-axis direction and defines the length of the channel region 220 (channel length). In the configuration example of FIG. 9A, the channel length is determined by the size L of the channel region in the X-axis direction and the channel width per one cell is twice the size of each cell in the Y-axis direction.

As shown in FIG. 10, in this embodiment, an additional doping layer 250 doped with n-type impurities is formed in the upper surface 200a of the semiconductor crystal 200 between two adjacent p-type base regions 22 (regions having a width indicated by the space S). The additional doping layer 250 corresponding to a portion of the n⁻ type drift layer 20 has an n-type impurity concentration higher than that of other portions of the n⁻ type drift layer 20. Since the n-type impurity concentration of the additional doping layer 250 is continuously varied along the vertical direction (the Z-axis direction), there is no definite boundary between the additional doping layer 250 and the other portions inside the n⁻ type drift layer 20. However, the thickness of the additional doping layer 250 can be defined as the thickness of a surface region having an impurity concentration higher than the n-type impurity concentration of the other portions (n⁻ type region) of the n⁻ type drift layer 20. In this embodiment, the thickness of the additional doping layer 250 may be set to fall within a range of, e.g., 1 μm to 5 μm.

As shown in FIG. 10, a pn junction surface 25 is formed at an interface between the p-type column region 24/p-type base region 22 (the p-type semiconductor region) and then type drift layer 20, thereby forming a parasitic diode (body diode). When a positive drain-source voltage $V_{DS}$ is applied, a reverse bias voltage is applied to the body diode. At this time, a depletion layer is extended from the pn junction surface 25 in a direction perpendicular to the pn junction surface 25. In addition, although it is shown in FIG. 10 that the pn junction surface 25 formed between the p-type column region 24 and the n⁻ type drift layer 20 has a flat shape, in reality, the shape of the pn junction surface 25 may be varied depending on a process of manufacturing the p-type column region 24. In an embodiment of a manufacturing method to be described later, periodical unevenness may be formed on the pn junction surface 25 in order to form the p-type column region 24 by means of a "multi-epitaxial method."

When the p-type impurity concentration in the p-type column region 24 and the n-type impurity concentration in the n⁻ type drift layer 20 are set to be equal to each other, the thickness (size in the X-axis) of the depletion layer extended from the pn junction surface 25 into the p-type column region 24 and the thickness (size in the X-axis) of the depletion layer extended from the pn junction surface 25 into the n⁻ type drift layer 20 becomes equal to each other. From the standpoint of increasing a breakdown voltage, the p-type impurity concentration in the p-type column region 24 and the n-type impurity concentration in the n⁻ type drift layer 20 can be set to substantially the same value.

When the positive drain-source voltage $V_{DS}$ is applied and rises, the depletion layer of the pn junction surface 25 between the additional doping layer 250 and the p-type base region 22 becomes thick. However, since the n-type impurity concentration in the additional doping layer 250 is higher than the n-type impurity concentration in the other portions of the n⁻ type drift layer 20, the thickness of the depletion layer formed in the additional doping layer 250 is suppressed to be relatively small. The thickness of the depletion layer formed in a portion contacting the gate insulating layer 40 is also suppressed. In this manner, an extension of the depletion layer immediately below the central portion of the gate electrode 42 is suppressed due to the existence of the additional doping layer 250. In general, the gate-drain capacitance $C_{gd}$ is lowered at the same time when the depletion layer located immediately below the central portion of the gate electrode 42 is extended. However, by forming the additional doping layer 250 on the n⁻ type drift layer 20, it is possible to prevent the gate-drain capacitance $C_{gd}$ from being lowered.

It has been conventionally considered that the gate-drain capacitance $C_{gd}$ is desirably low from the viewpoint of shortening a switching time (turn-on/off time). However, as a result of studies made by the present inventors, it has been unexpectedly found that adjusting the gate-drain capacitance $C_{gd}$ (=the feedback capacitance $C_{rss}$) to an appropriate value in the vicinity of a threshold of $V_{DS}$ in order to set $(C_{gs}+C_{gd})/C_{gd}$, i.e., $C_{iss}/C_{rss}$, to fall within a predetermined range makes a contribution to a prevention or suppression of a self-turn-on effect. In addition, by providing the additional doping layer 250, it is possible to appropriately lower on-resistance while effectively adjusting the gate-drain capacitance $C_{gd}$ (=the feedback capacitance $C_{rss}$) to an appropriate value in the vicinity of a threshold of $V_{DS}$.

In the upper surface 200a of the semiconductor crystal 200, the upper surface (p-type semiconductor region of the size "L" in the X direction) of the p-type base region 22 is located in a region ranging from the periphery of the p-type base region 22 to the n⁺ type source region 30, that is, between the n⁻ type drift layer 20 (the additional doping layer 250) and the n⁺ type source region 30. As shown in FIG. 10, this p-type semiconductor region is entirely covered by the gate electrode 42, forming the channel region 220.

As shown in FIG. 10, the gate electrode 42 faces the channel region 220 with the gate insulating layer 40 interposed therebetween. The gate electrode 42 may be formed from, e.g., polysilicon doped with impurities. The gate insulating layer 40 may be formed of, e.g., a silicon oxide film, a silicon nitride film, a silicon oxynitride film, a hafnium oxide film, an alumina film or a tantalum oxide film. The gate insulating layer 40 and the gate electrode 42 have substantially the same planar pattern to cover a portion of the n⁺ type source region 30, the entire channel region 220 and a surface (the additional doping layer 250) of then type drift layer 20. The gate electrode 42 is formed to control a plurality of cells in common.

The interlayer insulating film 50 may be made of a dielectric material such as, e.g., a silicon oxide film, a silicon nitride film, tetraethoxysilane (TEOS) or the like. The interlayer insulating film 50 covers the upper surface and side surface of the gate electrode 42 and has a contact hole 60 reaching the central portion of the p-type base region 22 of each cell and a portion of the n⁺ type source region 30 continuous with the central region.

Again referring back to FIG. 8, the source electrode 32 may be made of metal such as aluminum or the like. The source electrode 32 covers the surface of the interlayer insulating film 50 and makes contact with the n⁺ type source region 30 and the p-type base region 22 via the contact hole 60 of each cell. Such contact forms an ohmic contact. The source electrode 32 is connected in parallel to the plurality of cells. The drain electrode 12 may be made of metal such as aluminum or the like. The drain electrode 12 is in contact with the rear surface of the n⁺ type drain layer 10. The drain electrode 12 is connected in parallel to the plurality of cells.

The total current flowing through the plurality of cells flows into the drain electrode 12 and the source electrode 32. When the drain electrode 12 is set at a higher potential side and the source electrode 32 is set at a lower potential side, a reverse bias is applied to the body diode. At this time, when a control voltage lower than a predetermined threshold voltage is applied to the gate electrode 42, no current path is formed between the drain and the source and the semiconductor device 100 is in a turn-off state. When a control voltage equal to or higher than the predetermined threshold voltage is applied to the gate electrode 42, an inversion layer (channel) is formed on the surface of the channel region 220 and a conduction is made between the n⁺ type source region 30 and then type drift layer 20. Therefore, a current path from the source electrode 32, through the n⁺ type source region 30, the inversion layer of the channel region 220, and the n⁻ type drift layer 20, to the drain electrode 12 is formed and the semiconductor device 100 is in a turn-on state. In the semiconductor device 100 of this embodiment, a threshold of the transistor may be set to, e.g., about 4 volts.

In the semiconductor device 100 of the embodiment of the present disclosure, in order to suppress or prevent a self-turn-on effect, $(C_{gs}+C_{gd})/C_{gd}$ is set to be equal to or more than 4 (preferably 5) and equal to or less than 30 with the drain-source voltage $V_{DS}$ of 5 volts. In addition, the additional doping layer 250 doped with the n-type impurities is formed on the surface of the n⁻ type drift layer 20 (see FIG. 10). Therefore, the semiconductor device 100 of the embodiment of the present disclosure can be suitably used, e.g., as a switching element of the inverter shown in FIG. 3.

<Method for Manufacturing SJ-MOSFET>

One example of a method for manufacturing the semiconductor device 100 of this embodiment will now be described with reference to FIGS. 11A to 11I. The semiconductor device 100 according to this embodiment is not limited to the illustrated method but may be manufactured according to other methods.

Figure 11A:
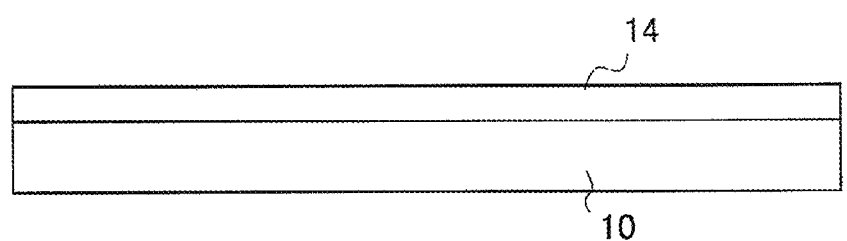
FIG. 11A is a process sectional view of a method for manufacturing the semiconductor device 100 according to an embodiment.

First, as shown in FIG. 11A, an initial growth layer 14 is formed on the n⁺ drain layer 10 by epitaxial growth. The initial growth layer 14 has specific resistance of, e.g., 1 Ω·cm to 10 Ω·cm and thickness of, e.g., 5 μm to 20 μm.

Figure 11B:
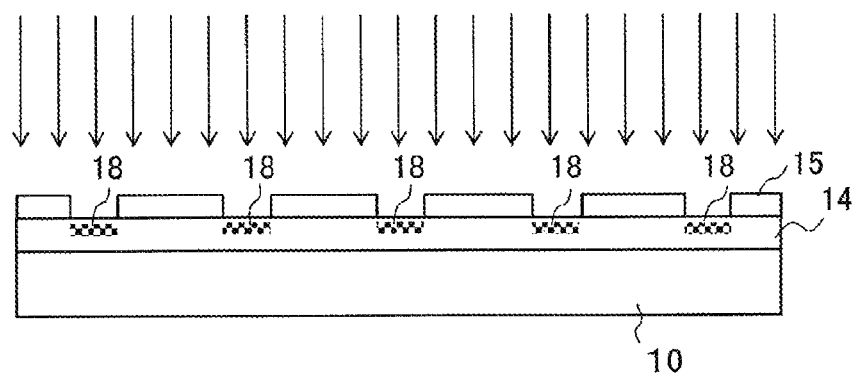
FIG. 11B is a process sectional view of a method for manufacturing the semiconductor device 100 according to an embodiment.

Next, as shown in FIG. 11B, a selected region 18 of the initial growth layer 14 is doped with p-type impurities. In the example shown in FIG. 11B, first, an implantation mask 15 is formed on the initial growth layer 14 by a photolithographic process. The shape and the position of the region 18 correspond to the shape and the position according to the planar layout of the p-type column region 24. The implantation mask 15 has a planar pattern to mask portions other than the region 18 of the initial growth layer 14. Next, p-type impurities are injected (or implanted) into a portion (the region 18) where the p-type column region 24 of the initial growth layer 14 is to be formed, by an ion implantation process. For example, a dose of $5.3 \times 10^{13}$ cm⁻² of boron ions is implanted with acceleration energy of 50 keV. The implantation mask 15 is removed after the ion implantation process.

Figure 11C:
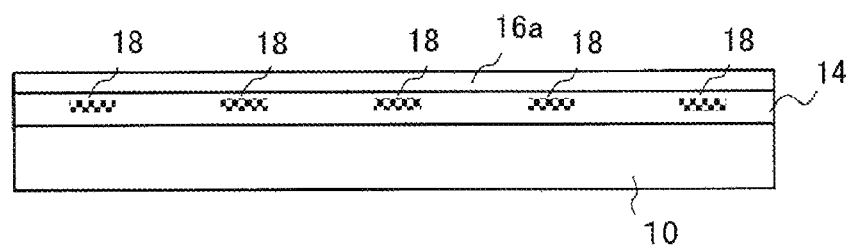
FIG. 11C is a process sectional view of a method for manufacturing the semiconductor device 100 according to an embodiment.

As shown in FIG. 11C, an n-type semiconductor layer 16a is epitaxially grown on the initial growth layer 14. The thickness of the n-type semiconductor layer 16a is, e.g., 2 μm to 10 μm and its specific resistance may be set to 1 Ω·cm to 10 Ω·cm.

Figure 11D:
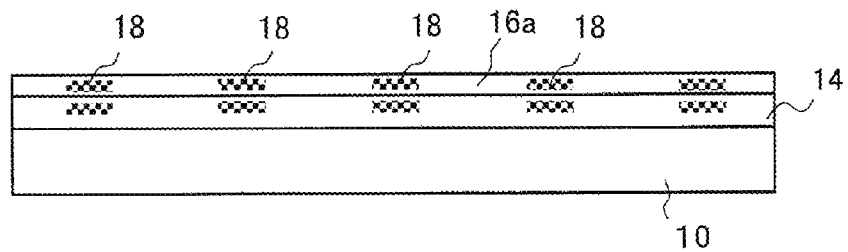
FIG. 11D is a process sectional view of a method for manufacturing the semiconductor device 100 according to an embodiment.
Figure 11E:
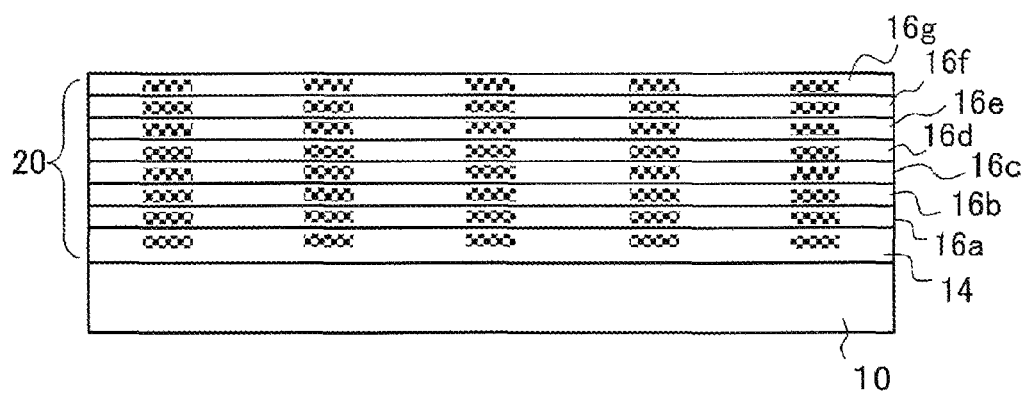
FIG. 11E is a process sectional view of a method for manufacturing the semiconductor device 100 according to an embodiment.

Thereafter, according to the same process as that described with reference to FIG. 11B, p-type impurities are injected into a selected region 18 of the n-type semiconductor layer 16a, as shown in FIG. 11D. A mask (not shown) defining the shape and the position of the region 18 is the same as the mask used in the process of FIG. 11B. By repeating such epitaxial growth of the n-type semiconductor layer and selective ion implantation of the p-type impurities, it is possible to form the n⁻ type drift layer 20 locally doped with the p-type impurities, as shown in FIG. 11E. The n⁻ type drift layer 20 includes laminated n-type semiconductor layers 16a, 16b, 16c, 16d, 16e, 16f and 16g. The n-type semiconductor layers 16a to 16g have the same epitaxial growth conditions and p-type impurity ion implantation conditions. Such a process is called "multi-epitaxial growth" which is known in the art to form a super junction structure. Although in this embodiment the n⁻ type drift layer 20 is formed by laminating the initial growth layer 14 and the seven n-type semiconductor layers 16a to 16g, the present disclosure is not limited thereto.

Figure 11F:
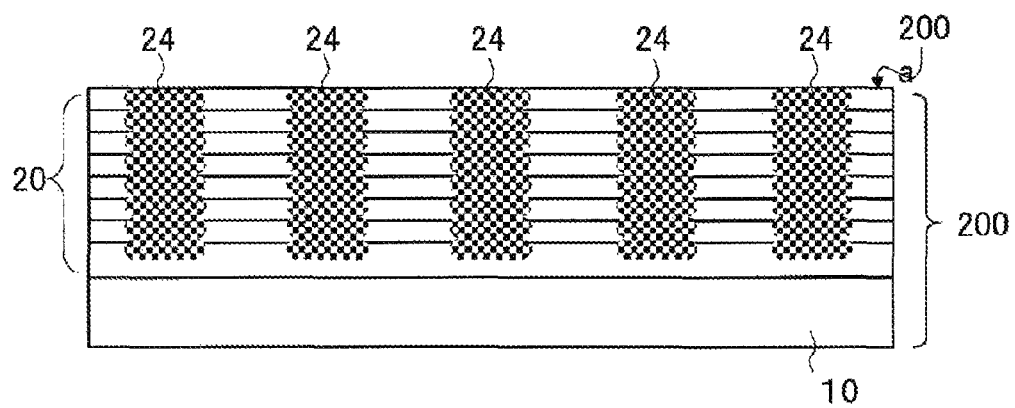
FIG. 11F is a process sectional view of a method for manufacturing the semiconductor device 100 according to an embodiment.

For example, by performing heat treatment a temperature of 1000 degrees C. to 1200 degrees C., p-type impurities of the n-type semiconductor layers 16a to 16g are diffused to thereby form the p-type column region 24, as shown in FIG. 11F. By coordinating positions in the n-type semiconductor layers 16a to 16g at which the p-type impurities are injected, it is possible to form the p-type column region 24 extending continuously in the vertical direction.

Figure 11G:
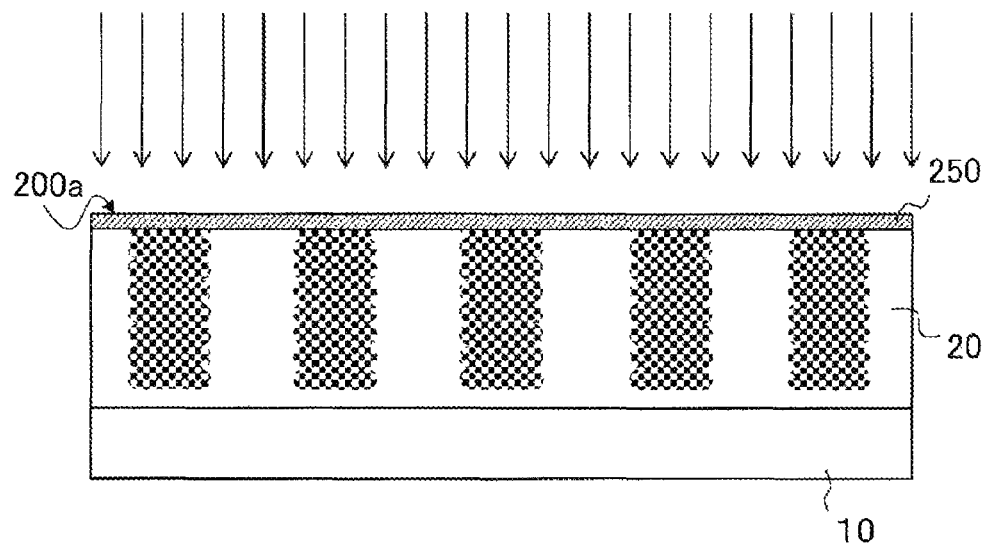
FIG. 11G is a process sectional view of a method for manufacturing the semiconductor device 100 according to an embodiment.

Thereafter, as shown in FIG. 11G, the n-type impurity additional doping layer 250 is formed by doping the upper surface 200a of the semiconductor crystal 200 with n-type impurities. For example, phosphorus ions of $1.0 \times 10^{12}$ to $2.0 \times 10^{12}$ cm⁻² are implanted with acceleration energy of 150 keV. An implantation angle may be set to 7 degrees. With this process, the n-type impurity concentration in the upper surface of the n⁻ type drift layer 20 is locally increased. In addition, a portion (the uppermost) of the p-type column region 24 can be also of n-type. The n-type impurity additional doping layer 250 is included in a portion of the n⁻-type drift layer 20. The ion implantation acceleration energy used to form the n-type impurity additional doping layer 250 may be set to fall within a range of, e.g., 100 to 200 keV.

Thereafter, the gate insulating layer 40 is formed to cover the upper surface 200a of the semiconductor crystal 200. The gate insulating layer 40 can be formed by thermally oxidizing the upper surface 200a of the semiconductor crystal 200. The gate electrode 42 is formed on the gate insulating layer 40. The gate electrode 42 can be formed, for example by covering the gate insulating layer 40 with a polysilicon film added with impurities and then patterning the polysilicon film. Although the gate insulating layer 40 can be also patterned when the polysilicon film is patterned, the patterning of the gate insulating layer 40 is performed later in this embodiment. The patterning of the polysilicon film can be performed by forming an etching mask (not shown) defining the shape and the position of the gate electrode 42 by photolithography and then performing an anisotropic dry etching process. The etching mask is removed after the patterning of the polysilicon film.

Figure 11H:
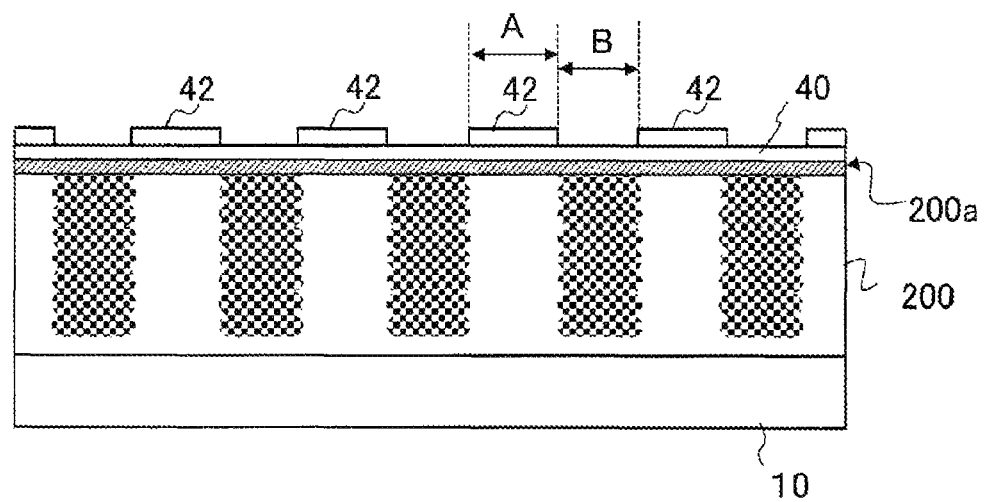
FIG. 11H is a process sectional view of a method for manufacturing the semiconductor device 100 according to an embodiment.

The size A of the gate electrode 42 and the size B of a space of the gate electrode 42 are shown in FIG. 11H. The size A serves as a parameter used to control a dose of n-type impurities in the above-described n-type impurity additional doping layer 250 and $C_{iss}/C_{rss}$ for $V_{DS}$ of 5 volts. In this embodiment, size A+size B is set to 12 μm and the size A is set to fall within a range of 8 to 10 μm. In this embodiment, a value of A/(A+B) is adjusted to a range of 0.5 to 0.8. Size A+size B corresponds to, e.g., the cell pitch P1 shown in FIG. 9A.

Figure 11I:
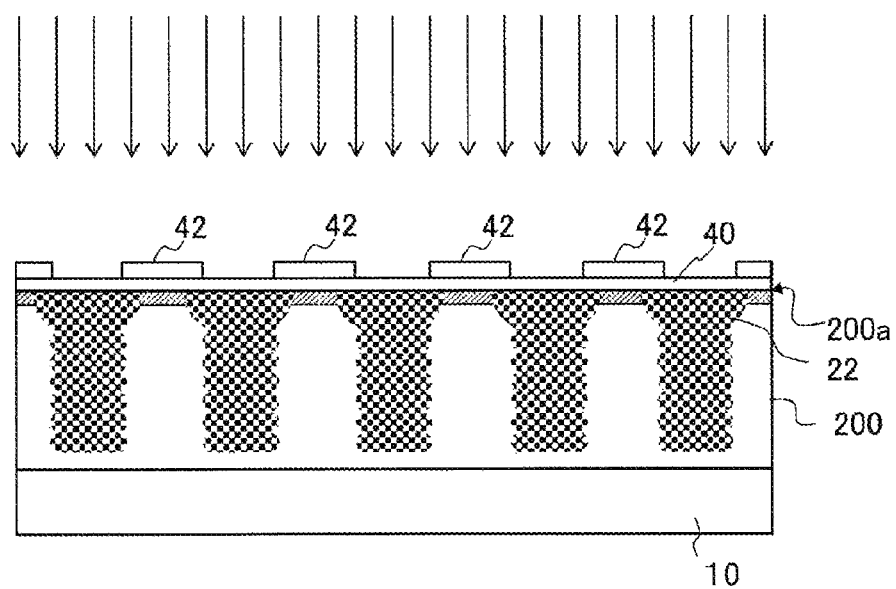
FIG. 11I is a process sectional view of a method for manufacturing the semiconductor device 100 according to an embodiment.

Next, as shown FIG. 11I, the p-type base region 22 is formed by doping a region of the upper surface 200a of the semiconductor crystal 200, which is not covered by the gate electrode 42, with p-type impurities. For example, boron ions of $5.0 \times 10^{15}$ cm⁻² are implanted with acceleration energy of 50 keV. An implantation angle may be set to 7 degrees. The boron ions are implanted into the semiconductor crystal through the gate insulating layer 40 located in the region not covered by the gate electrode 42. The boron ions are not implanted into a region masked by the gate electrode 42. Therefore, the p-type base region 22 is formed in a self-aligned manner with respect to the gate electrode 42.

Thereafter, through heat treatment such as impurity activation, the p-type impurities implanted to form the p-type base region 22 are diffused in both of the vertical and horizontal directions. Therefore, the p-type base region 22 is also extended in the horizontal direction toward the central portion of the region covered by the gate electrode 42.

Since a portion of the n-type impurity additional doping layer 205, which is doped with p-type impurities to form the p-type base region 22, is higher in p-type impurity concentration higher than n-type impurity concentration, the n-type semiconductor region is changed to a p-type semiconductor region. Therefore, the n-type impurity additional doping layer 250 partially remains in only a region of the upper surface of the n⁻-type drift layer 20, in which the p-type base region 22 does not exist. In comparison with a case where no n-type impurity doping is performed to form the n-type impurity additional doping layer 250, a space (the width of the n-type impurity additional doping layer 250, or the length indicated by a symbol "S" in FIG. 10) between two adjacent p-type base regions 22 is further extended. This is because, in a region lower in p-type impurity concentration than n-type impurity concentration in the additional doping layer 250, the n-type semiconductor region is not changed to the p-type semiconductor region and the region does not act as the p-type base region 22. The channel length can be reduced due to the existence of the additional doping layer 250.

The subsequent process will be described below with reference to FIG. 8.

After forming the p-type base region 22, the $n^+$-source region 30 as shown in FIG. 8 is formed by selectively doping a region of a predetermined width, which has its outer edge at a position retracted inward by a predetermined distance from the outer periphery of the p-type base region 22. For example, a dose of $2.0 \times 10^{15}$ cm$^{-2}$ of phosphorus ions is implanted with acceleration energy of 130 keV. An implantation angle may be set to 7 degrees. Ion implantation for forming the $n^+$-source region 30 is performed after forming an implantation mask having an opening defining the shape and the position of the $n^+$-source region 30. The implantation mask is removed after the ion implantation.

Thereafter, the interlayer insulating film 50 having a thickness of, e.g., 1000 nm is deposited to cover the gate electrode 42. By patterning the interlayer insulating film 50 and the gate insulating layer 40, the contact hole 60 is formed to expose the surface of the p-type base region 22. The patterning of the interlayer insulating film 50 can be performed by forming a mask having an opening defining the shape and the position of the contact hole 60 by photolithography and then performing an anisotropic dry etching process. The mask is removed after the patterning of the interlayer insulating film 50.

The source electrode 32 is formed on the interlayer insulating film 50. A process of forming the source electrode 32 may include a step of forming a barrier layer of, e.g., Ti/TiN (e.g., 25/130 nm in thickness) and a step of depositing an AlCu film (e.g., 4.2 µm in thickness) on the barrier layer.

Thereafter, in this embodiment, heavy particles are irradiated onto the semiconductor crystal 200 from the rear side of the $n^+$-type drain layer 10. Particle species used may be one of proton, 3He$^{++}$ and 4He$^{++}$. A dose of irradiation of heavy particles may be set to fall within a range of, e.g., $5 \times 10^{10}$ to $5 \times 10^{12}$ cm$^{-2}$. Implantation acceleration energy can be such adjusted that an attenuation peak position of heavy particle irradiation is included between the bottom of the p-type column region 24 and the upper surface of the $n^+$-type drain layer 10. Such heavy particle irradiation allows a trap level for accumulated carriers to be locally formed, thereby shortening the reverse recovery time $t_{rr}$ of the body diode. For example, the reverse recovery time $t_{rr}$ is set to be equal to or less than 150 nano seconds. When the reverse recovery time $t_{rr}$ is sufficiently reduced thus, the semiconductor device 100 of this embodiment can be suitably used in an inverter.

Next, a protective film (not shown) having a thickness of, e.g., 1.6 µm may be deposited. Thereafter, a pad opening for exposing a portion of the source electrode 32 is formed in the protective film.

The drain electrode 12 is formed on the rear surface of the $n^+$-type drain layer 10. The drain electrode 12 is formed, for example by depositing Ti, Ni, Au and Ag in this order by a sputtering method. Thereafter, heat treatment may be carried out to form an ohmic junction by alloying in a contact interface between each of the source electrode 8 and the drain electrode 11 and the semiconductor surface.

Although in this embodiment the p-type column region 24 is formed by multi-epitaxial growth, the manufacturing method of the present disclosure is not limited thereto. For example, the p-type column region 24 may also be formed by forming a deep trench in the $n^-$-type drift layer 20 and filling the deep trench with p-type transistor.

EXAMPLES

Figure 12:
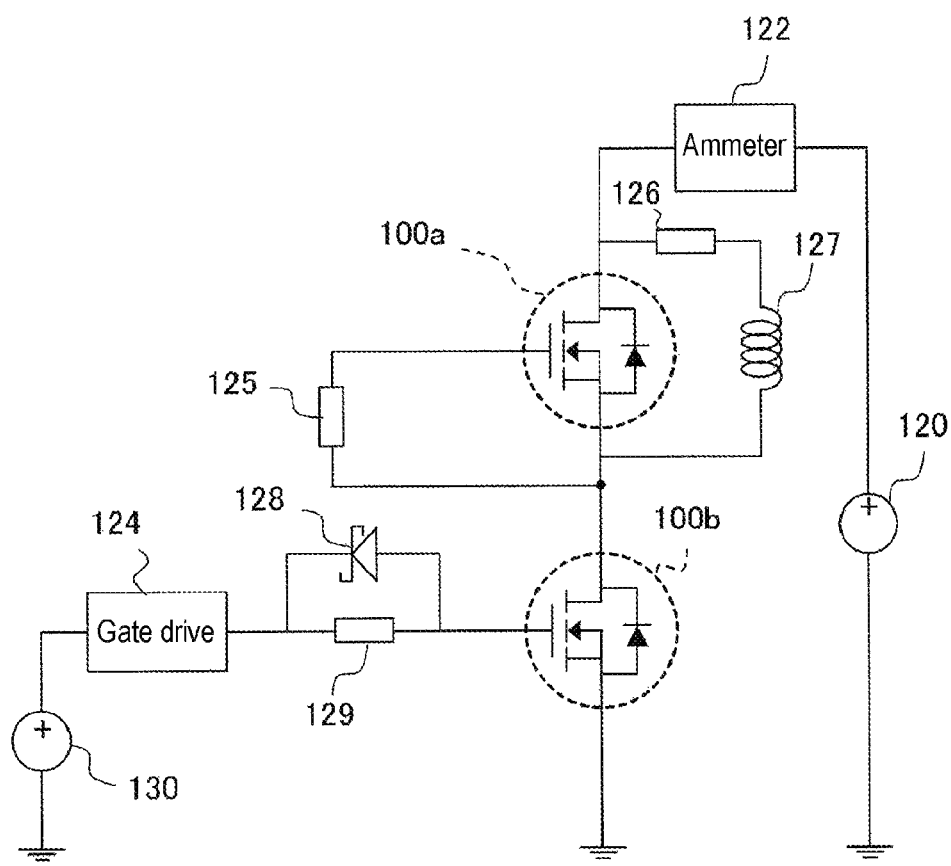
FIG. 12 is a view showing the configuration of a system for measuring a parasitic capacitance of the semiconductor device 100.

The semiconductor devices 100a and 100b having the configuration shown in FIG. 8 were manufactured according to the above-described manufacturing method example and characteristics evaluation on the occurrence of a self-turn-on effect was made using the measurement system shown in FIG. 12.

The measurement system of FIG. 12 includes a voltage source (its voltage: 100 volts) 120 for applying a voltage to a drain electrode of a high side semiconductor device 100a of two semiconductor devices 100a and 100b connected in series, and an ammeter 122 for measuring a current flowing through the semiconductor devices 100a and 100b. The semiconductor device 100a and the semiconductor device 100b have the same structure and show the same transistor characteristics.

As shown in FIG. 12, the measurement system includes an IGBT gate drive circuit 124 connected to a gate electrode of the low side semiconductor device 100b. The IGBT gate drive circuit 124 is connected to a pulse generator 130. In response to a signal from the pulse generator 130, the IGBT gate drive circuit 124 causes the low side semiconductor device 100b to perform a switching operation (turning on/off).

In the high side semiconductor device 100a, a gate electrode is short-circuited to a source electrode through a resistor 125 of 100Ω. In addition, the drain electrode and the source electrode of the high side semiconductor device 100a are interconnected y a resistor 126 and an inductor (100 micro-Henry) 127. A Schottky diode 128 and a resistor 129 are connected between the gate electrode of the low side semiconductor device 100b and the IGBT gate drive circuit 124.

Since the gate electrode of the high side semiconductor device 100a is short-circuited to the source electrode, the high side semiconductor device 100a is inherently always set in a turn-off state. Accordingly, when the low side semiconductor device 100a is in a turn-on state, a current flows into the low side semiconductor device 100b through the resistor 126 and the inductor 127.

However, as the semiconductor devices 100a and 100b, an Example and a Comparative Example in which the size A of the gate electrode and the n-type impurity concentration in the upper surface of the $n^-$-type drift layer 20 were varied with different values were prepared and results of evaluation made by the above measurement system have revealed the following facts (i) to (v).

(i) $C_{iss}/C_{rss}$ is greatly varied depending on a value of $V_{DS}$. Therefore, for example, even in a semiconductor device (SJ-MOSFET) in which $C_{iss}/C_{rss}$ at $V_{DS}$ of 50 volts has a large value exceeding 100, $C_{iss}/C_{rss}$ at $V_{DS}$ of 5 volts may have a small value below 5. In addition, even when $C_{iss}/C_{rss}$ at $V_{DS}$ of 50 volts has a large value exceeding 100, a self-turn-on effect may occur. Studies made by the present inventors have revealed that $C_{iss}/C_{rss}$ near $Y_{DS}$ of a transistor threshold (about 4 volts in the Example), that is, $C_{iss}/C_{rss}$ at $V_{DS}$ of 5 volts, determines the easiness of the occurrence of a self-turn-on effect of the SJ-MOSFET.

Figure 13:
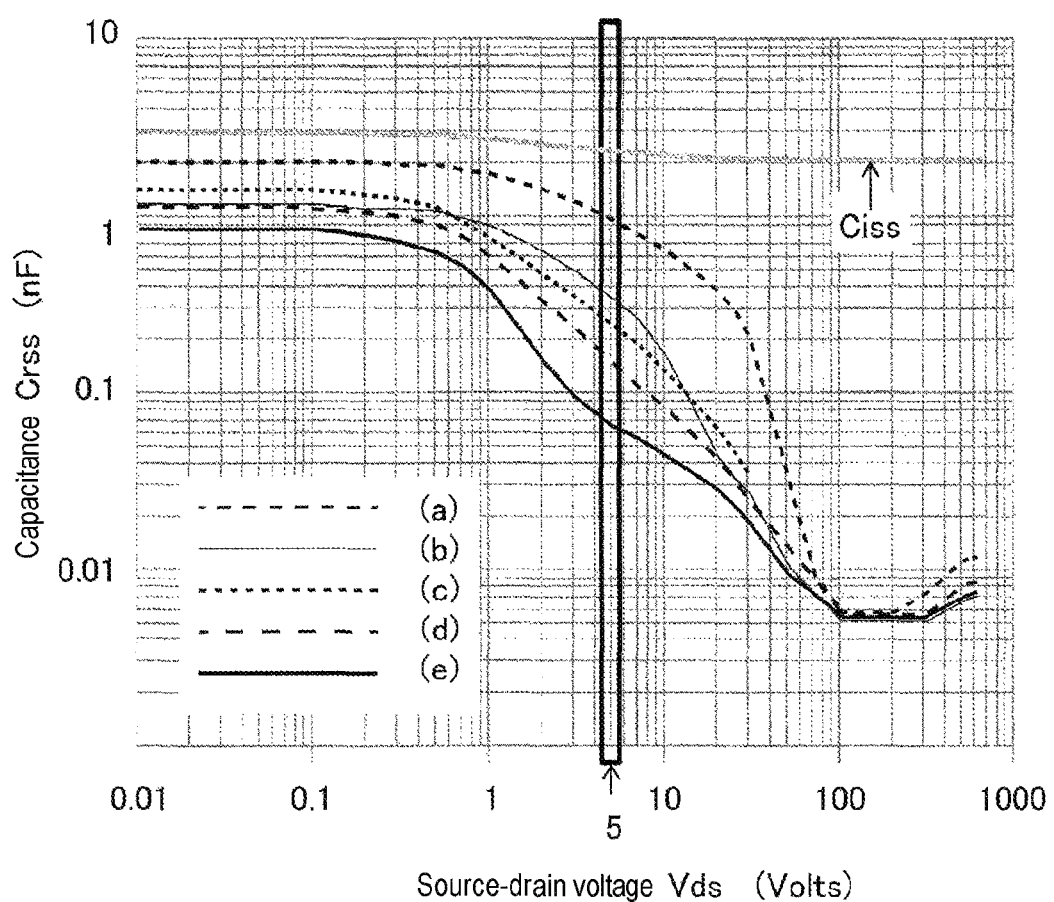
FIG. 13 is a graph showing some of results of measurement on a capacitance $C_{rss}$.

FIG. 13 is a graph showing an example of $V_{DS}$ dependency of feedback capacitance $C_{rss}$, i.e., gate-drain capacitance $C_{gd}$, in regard to Example and Comparative Example of a semiconductor device. The capacitance was measured under conditions of temperature Ta of 25 degrees C. and frequency f of one megahertz. A difference in configuration between the Example and the Comparative Example, i.e., between samples (a) to (e), will be described later.

As can be seen from FIG. 13, $C_{rss}$ at $V_{DS}$ of 0.1 volt or less is about 1 to 2 nanofarads (nF), whereas $C_{rss}$ at $V_{DS}$ of 100 volts is less than 0.001 nF, showing a change of size in an order of two-digit. The reason why a higher $V_{DS}$ provides a smaller $C_{rss}$ is that the higher $V_{DS}$ provides a thicker depletion layer immediately below the gate electrode.

In the example shown in FIG. 13, $C_{rss}$ of samples (b) and (c) at $V_{DS}$ of 30 volts is about 0.03 nF and 0.04 nF, respectively. That is, $C_{rss}$ of sample (b) is smaller than $C_{rss}$ of sample (c). On the other hand, $C_{rss}$ of samples (b) and (c) at $V_{DS}$ of 5 volts is about 0.35 nF and 0.25 nF, respectively. That is, $C_{rss}$ of sample (b) is larger than $C_{rss}$ of sample (c). In this way, the $V_{DS}$ dependency of $C_{rss}$ is greatly varied depending on a structure of the semiconductor device. A value of $C_{iss}/C_{rss}$ is greatly varied depending on $V_{DS}$. Even when the value of $C_{iss}/C_{rss}$ is employed as an indicator in order to prevent or suppress the self-turn-on effect, the value of $C_{iss}/C_{rss}$ may lose its technical meaning depending on a set range of $V_{DS}$ values. In addition, most of input capacitance $C_{iss}=C_{gd}+C_{gs}$ is occupied by $C_{gs}$. Therefore, the input capacitance $C_{iss}$ has a very small $V_{DS}$ dependency. For reference, the input capacitance $C_{iss}$ is also shown in FIG. 13.

(ii) According to studies (including experiments on samples not shown in FIG. 13) made by the present inventors, no self-turn-on effect occurred in samples in which $C_{iss}/C_{rss}$ near $V_{DS}$ of a transistor threshold (about 4 volts in the Example), that is, $C_{iss}/C_{rss}$ at $V_{DS}$ of 5 volts, is equal to or more than 4 and equal to or less than 30. In this case, when the low side semiconductor device 100b is turned on from the turn-off state, the high side semiconductor device 100a remains turned-off without being turned-on and a current flows through the resistor 126 and the inductor 127 connected in parallel to the semiconductor device 100a. It has been confirmed that a current value measured by the ammeter 122 is slowly increased due to a counter electromotive force of the inductor 127. In addition, the potential of the gate electrode of the high side semiconductor device 100a is below the threshold of 4 volts.

(iii) In samples (including samples other than the samples shown in FIG. 13) in which $C_{iss}/C_{rss}$ at $V_{DS}$ of 5 volts is out of the range of 4 to 30, when the low side semiconductor device 100b is turned on from the turn-off state, the high side semiconductor device 100a is accordingly turned on and a current (a through current) flows through the semiconductor device 100a. It has been confirmed that a current value measured by the ammeter 122 is steeply increased and flows inside the semiconductor device 100a rather than the inductor 127. In addition, the potential of the gate electrode of the high side semiconductor device 100a is above the threshold of 4 volts.

(iv) In order to control $C_{iss}/C_{rss}$ near $V_{DS}$ of a transistor threshold (about 4 volts in the Example), that is, $C_{iss}/C_{rss}$ at $V_{DS}$ of 5 volts, to fall within the range of 4 to 30, it has been found that it is very effective to form an n-type impurity additional doping layer immediately below the gate electrode. In particular, it has been found that it is desirable to set a dose of impurity ion implantation for forming the additional doping layer to $1.0 \times 10^{12}/cm^2$ to $2.0 \times 10^{12}/cm^2$. When a space between two adjacent base regions in the surface of the drift layer is equal to or more than 1 μm and equal to or more than 2 μm, the effect of the additional doping layer is sufficiently exhibited. In addition, by adjusting a ratio of size A of the gate electrode to size A+size B, $C_{iss}/C_{rss}$ near $V_{DS}$ of a transistor threshold (about 4 volts in the Example) could be adjusted.

(v) When $C_{iss}/C_{rss}$ at $V_{DS}$ of 5 volts was within the range of 4 to 30, a remarkable effect on self-turn-on prevention was exhibited.

Hereinafter, characteristics of the semiconductor device which acquired data shown in the graph of FIG. 13 will be described.

A difference between the samples (a) to (e) is as follows.

(a) Gate size A=10 μm, with additional doping layer (dose: $2.0 \times 10^{12}$ cm$^{-2}$)
(b) Gate size A=8 μm, without additional doping layer (dose: $1.0 \times 10^{12}$ cm$^{-2}$)
(c) Gate size A=10 μm, without additional doping layer
(d) Gate size A=9 μm, without additional doping layer
(e) Gate size A=8 μm, without additional doping layer In common for other components, a value of A+B is equally set to 12 μm.

For the samples (a) to (e), $C_{iss}$, $C_{rss}$ and $C_{iss}/C_{rss}$ at $V_{DS}$ of 5 volts and the existence or not of a self-turn-on effect evaluated by the measurement system of FIG. 12 are as listed in the following table 1. A value of parasitic capacitance hardly depends on measurement temperature.

TABLE 1

| Sample | $C_{iss}$ (pF) | $C_{rss}$ (pF) | $C_{iss}/C_{rss}$ | Self-turn-on |
|---|---|---|---|---|
| (a) | 2600 | 1000 | 2.6 | ○ |
| (b) | 2100 | 350 | 6 | X |
| (c) | 2600 | 260 | 10 | X |
| (d) | 2600 | 160 | 16 | X |
| (e) | 2000 | 65 | 30 | X |

<Modifications>

Figure 14:
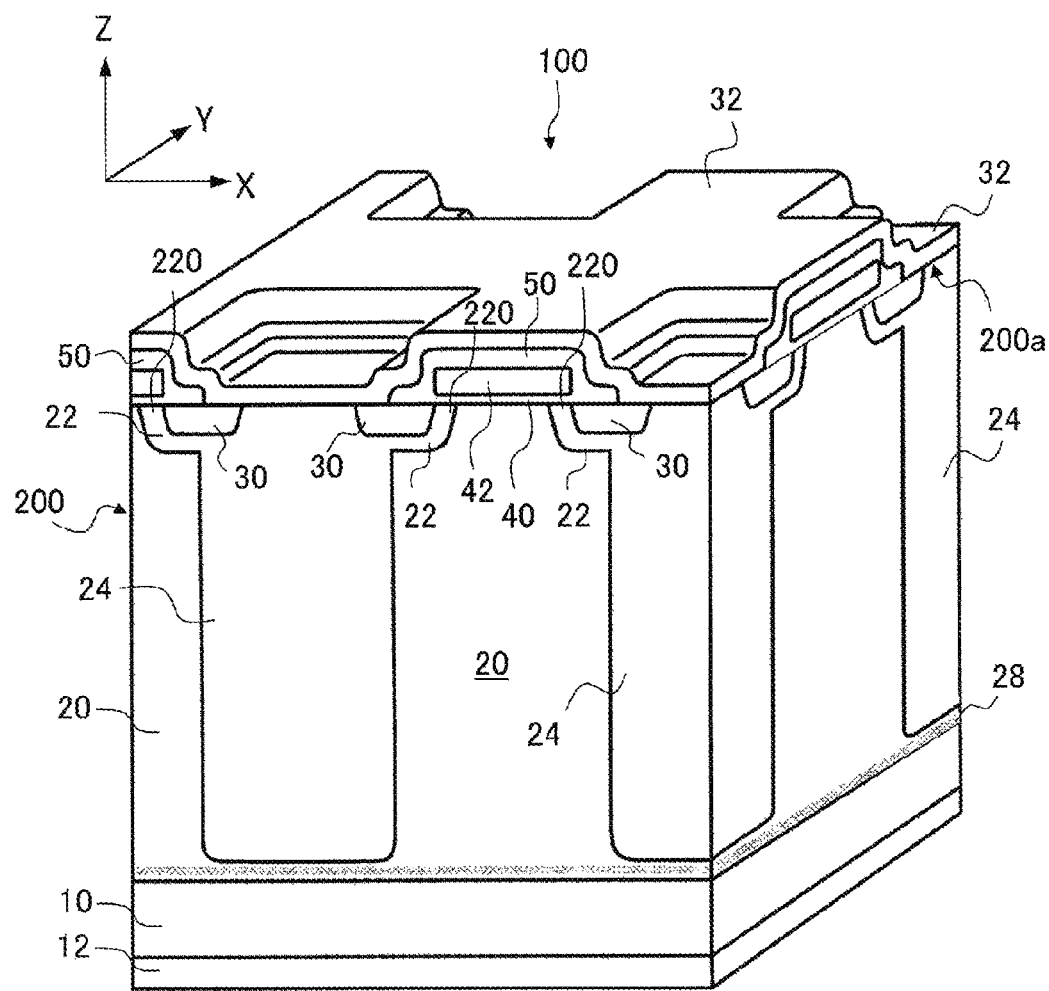
FIG. 14 is a perspective view showing a portion of an embodiment in which a p-type column region 24 has a columnar shape extending in the Z-axis direction.

Although in the example of FIG. 8 the p-type column region 24 extends in the strip shape, the p-type column region 24 is not limited to the stripe shape. The p-type column region 24 may extend, literally, in the vertical direction (Z-axis direction) in a columnar shape. FIG. 14 is a perspective view showing a portion of an embodiment in which the p-type column region 24 has a columnar shape extending in the Z-axis direction. In FIG. 14, the same elements as FIG. 14 are denoted by the same reference numerals.

Figure 15A:
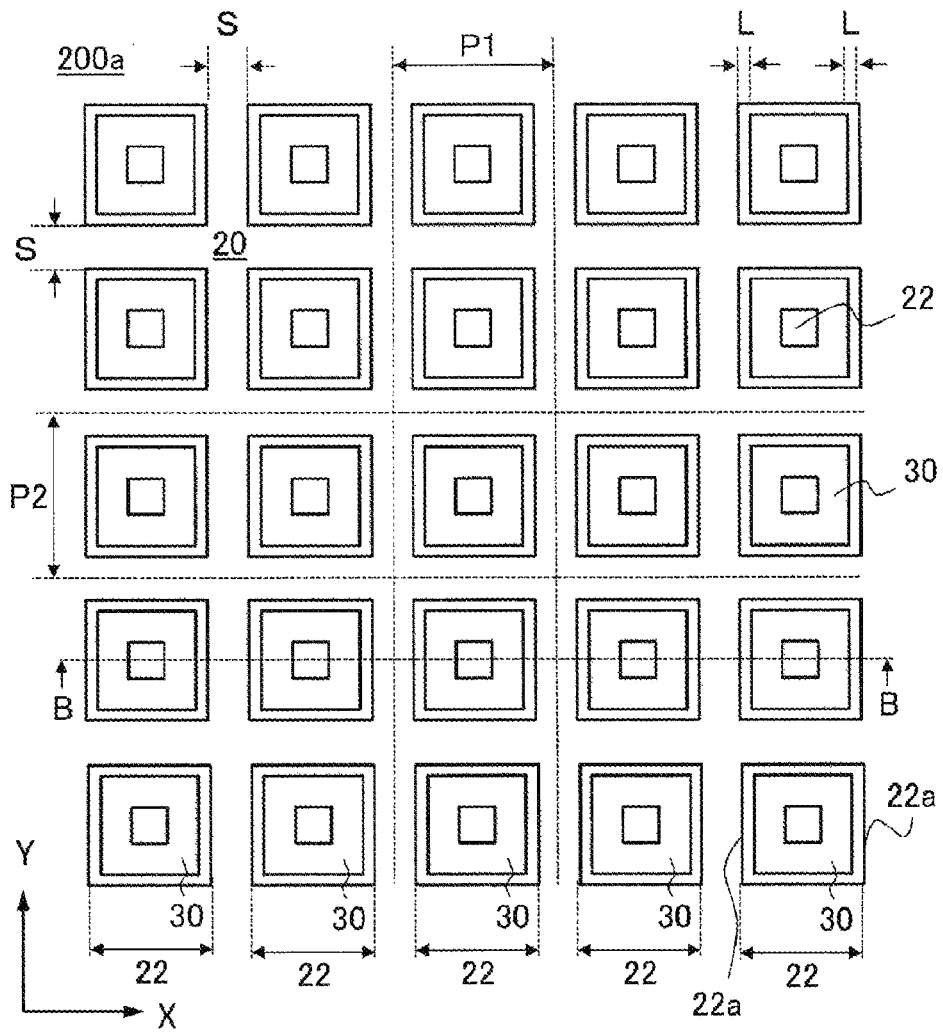
FIG. 15A is a plan view taken when a portion of the upper surface 200a (a surface parallel to the XY plane) of the semiconductor crystal 200 in the example shown in FIG. 14 is viewed in its normal (Z-axis) direction.
Figure 15B:
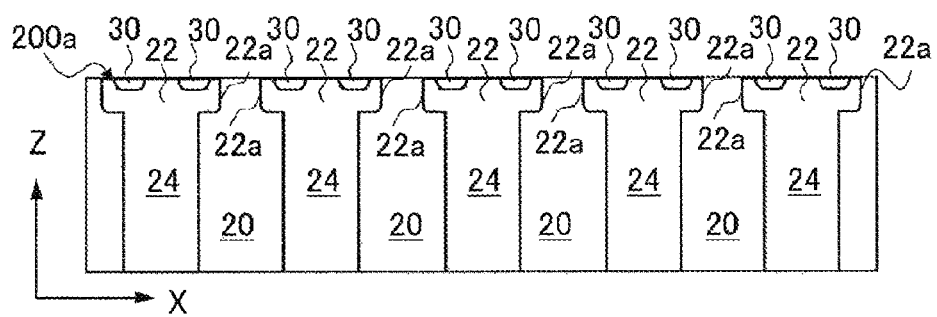
FIG. 15B is a sectional view taken along line B-B in FIG. 15A.

FIG. 15A is a plan view taken when a portion of the upper surface 200a (a surface parallel to the XY plane) of the semiconductor crystal 200 in the example shown in FIG. 14 is viewed in its normal (Z-axis) direction. FIG. 15B is a sectional view taken along line B-B in FIG. 15A. For simplification, only a portion of the semiconductor crystal 200 is shown in FIGS. 15A and 15B.

Figure 16A:
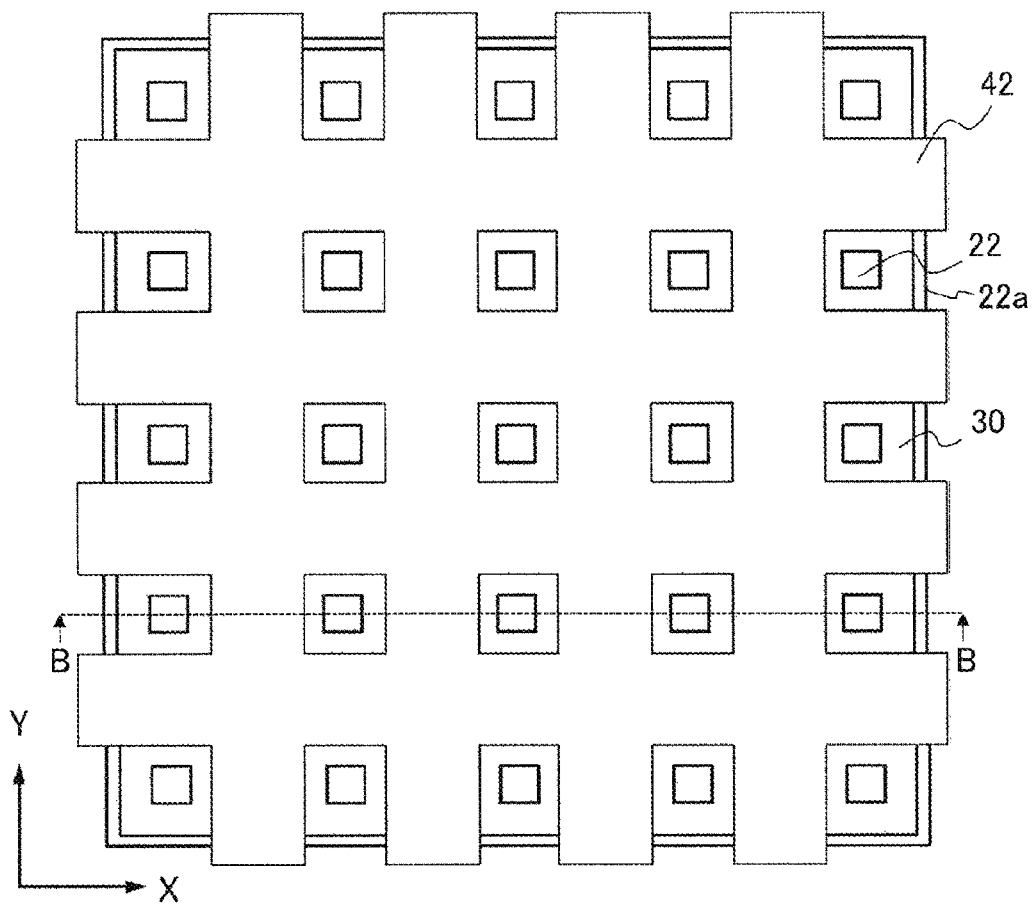
FIG. 16A is a view showing one example of a planar layout of a gate electrode 42 in a modification of the present disclosure.

In the example of FIG. 15A, the p-type base region 22 and p-type column regions 24 having a rectangular shape when viewed from top are periodically arranged along the X-axis and Y-axis directions. In this modification, although not required, the cell pitch P1 in the X-axis direction and the cell pitch P2 in the Y-axis direction are typically set to be equal to each other. FIG. 16A is a view showing one example of a planar layout of a gate electrode 42 in this modification.

Figure 16B:
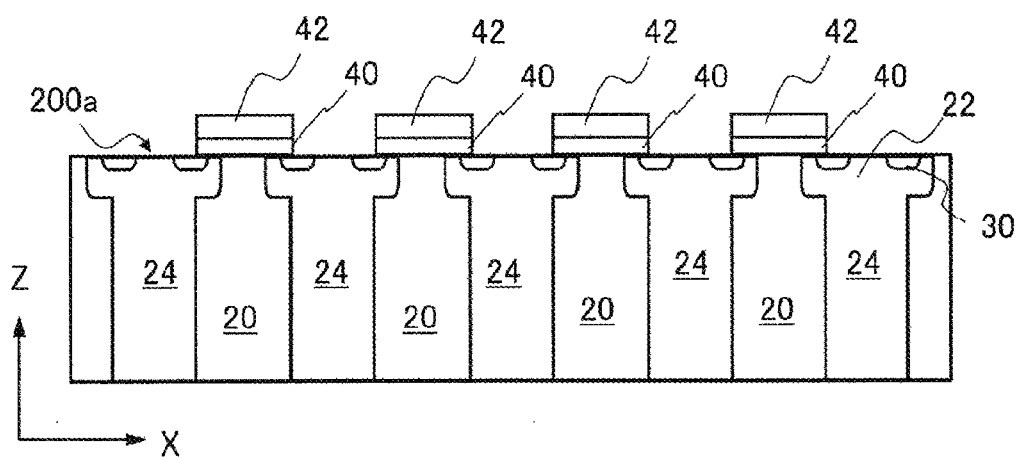
FIG. 16B is a sectional view taken along line B-B in FIG. 16A.

FIG. 16B is a sectional view taken along line B-B in FIG. 16A. The gate electrode 42 has a lattice shape extending in the X-axis and Y-axis directions.

Figure 17:
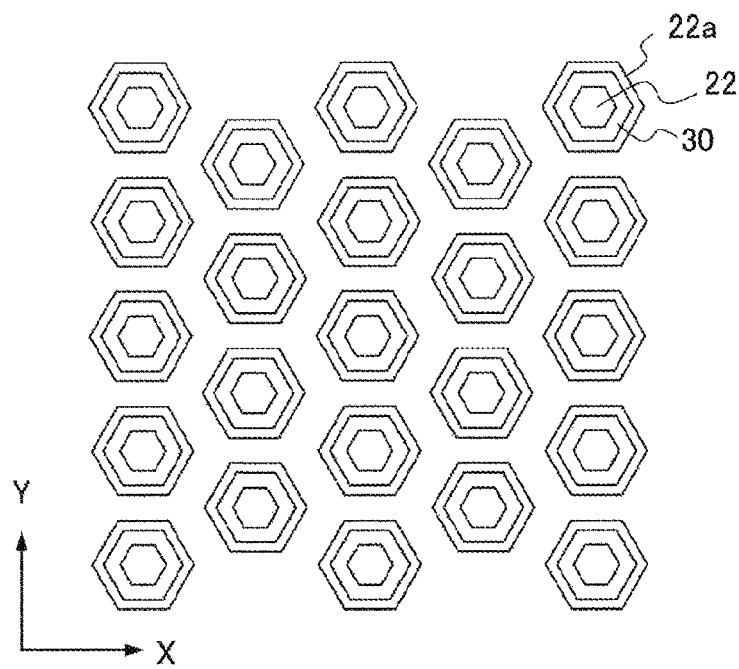
FIG. 17 is a plan view showing another example of the shape and arrangement of a p-type base region 22 and an n+-type source region 30.
Figure 18:
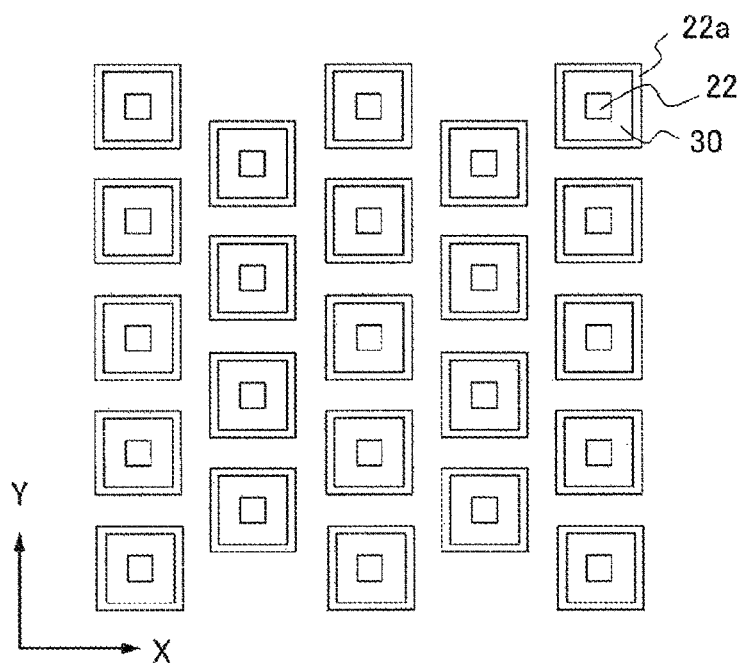
FIG. 18 is a plan view showing another example of the shape and arrangement of a p-type base region 22 and an n+-type source region 30.

FIGS. 17 and 18 are plan views showing other examples of the shape and arrangement of a p-type base region 22 and an n$^+$-type source region 30. In these examples, a p-type column region 24 extends in the Z-axis direction (a direction perpendicular to the sheet) from the central portion of the p-type base region 22. The p-type column region 24 is not particularly limited in shape and arrangement but may employ any configurations known in the art. In the semiconductor device 100 according to various embodiments of the present disclosure, most of a pn junction surface existing between the p-type column region 24 and the n$^-$-type drift layer 20 extends in the vertical direction to form a super junction structure, makings a high breakdown voltage and a low on-resistance compatible with each other.

<Package>

Figure 19A:
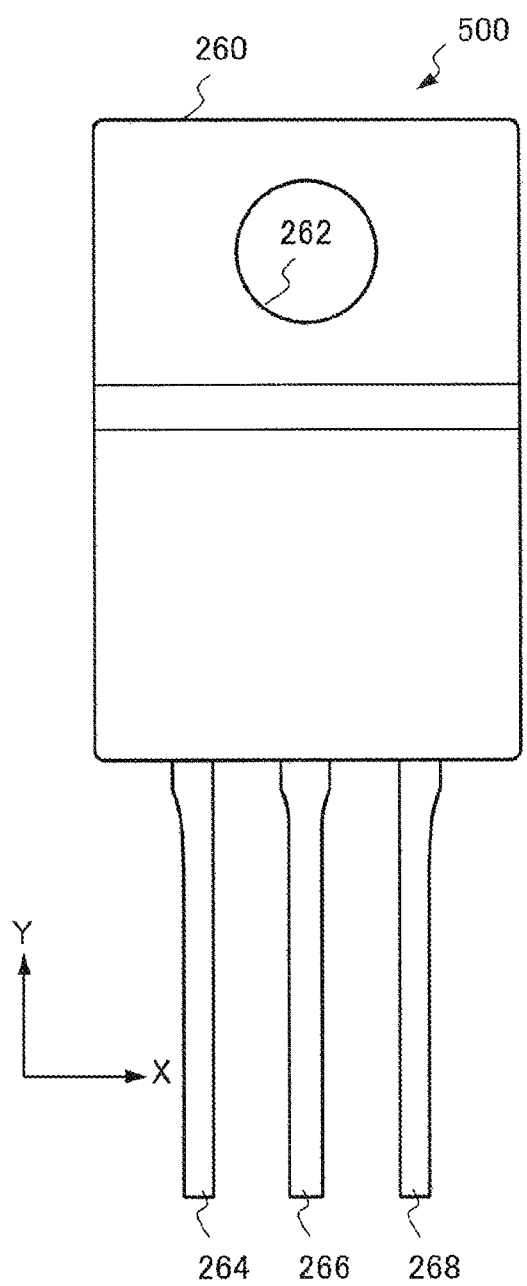
FIG. 19A is a top view showing the entire appearance of a semiconductor package 500 according to an embodiment of the present disclosure.
Figure 19B:
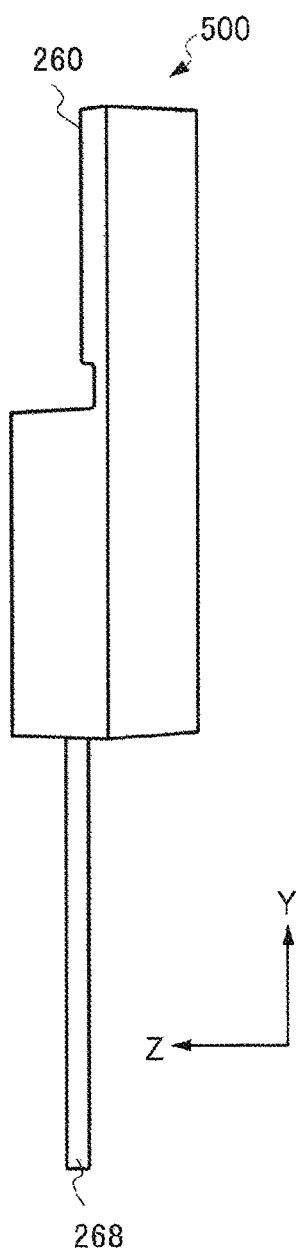
FIG. 19B is a side view showing the semiconductor package 500.

First, the general shape of a semiconductor package of the present disclosure will be described with reference to FIGS. 19A and 19B. FIG. 19A is a top view showing the entire appearance of a semiconductor package 500 according to an embodiment of the present disclosure. FIG. 19B is a side view showing the semiconductor package 500. An XY coordinate system including X and Y axes which are perpendicular to each other is shown in FIG. 19A and a YZ coordinate system including Y and Z axes which are perpendicular to each other is shown in FIG. 19B.

The semiconductor package 500 as shown includes a resin molding body 260 containing a semiconductor device (not shown in FIGS. 19A and 19B) according to the embodiment of the present disclosure in the form of a chip or die, and metal leads 264. 266 and 268 projecting from the resin molding body 260. A screw hole 262 is formed in the resin molding body 260. A screw for fixing the semiconductor package 500 to a heat sink (not shown) or the like is inserted in the screw hole 262. The screw hole is not essential for the semiconductor package of the present disclosure.

Figure 20A:
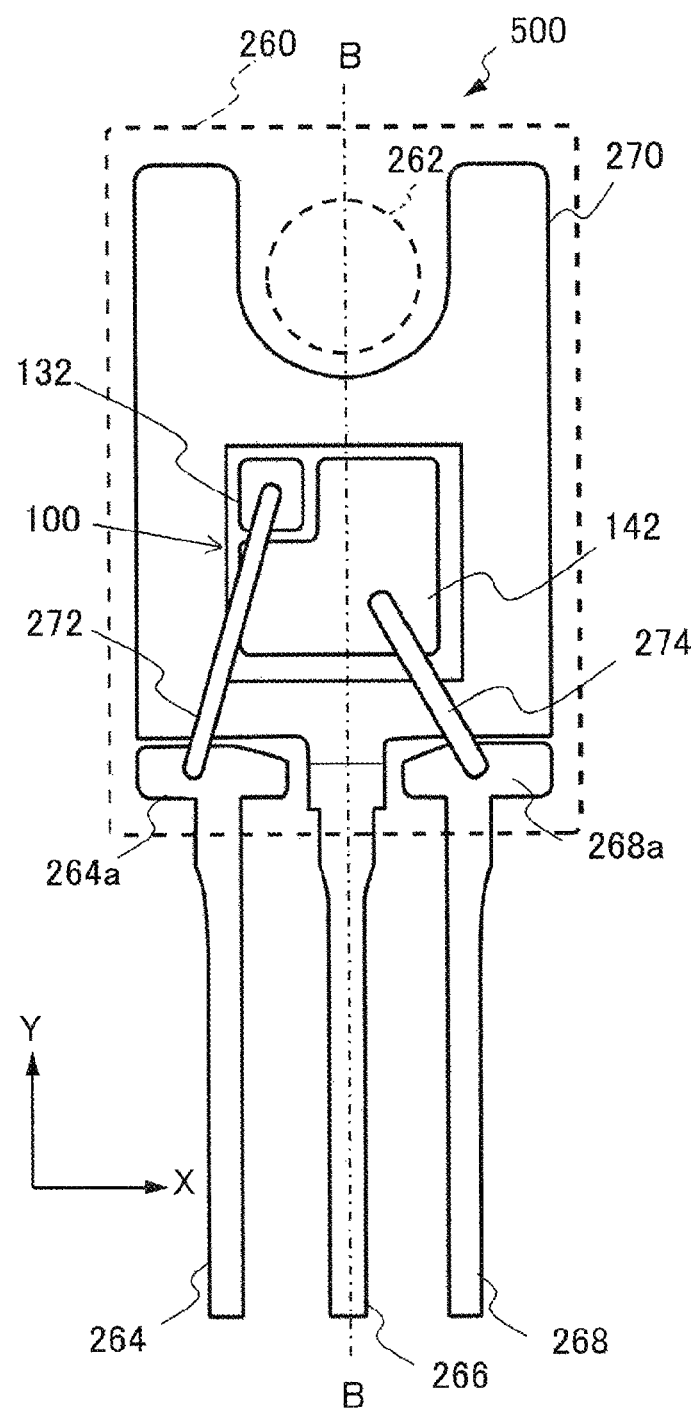
FIG. 20A is a top view showing the configuration of the semiconductor package 500 from which a resin molding body 260 is excluded.
Figure 20B:
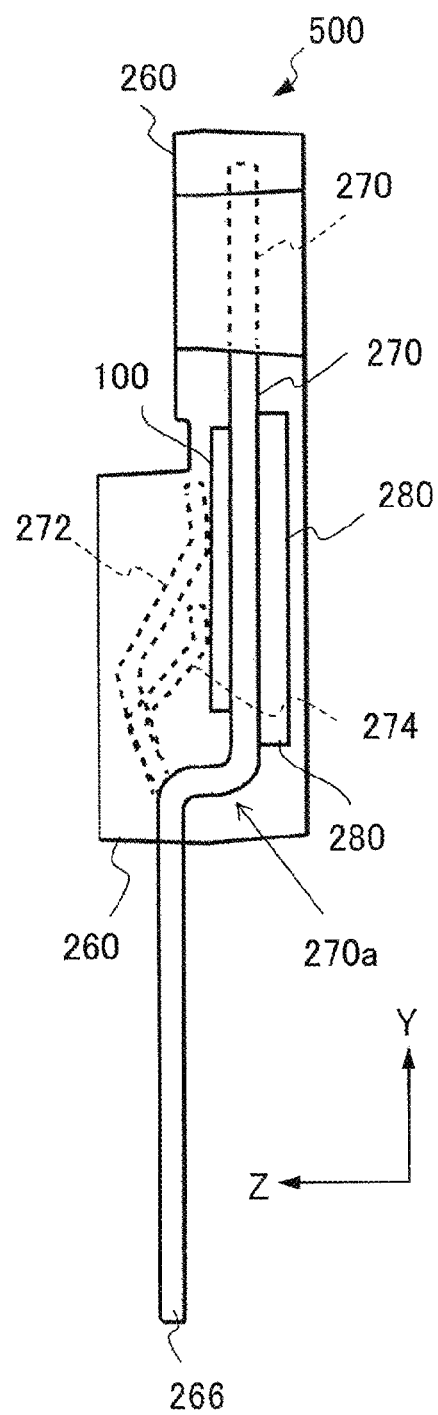
FIG. 20B is a sectional view taken along line B-B in FIG. 20A.

Next, an example of the internal configuration of the semiconductor package 500 will be described with reference to FIGS. 20A and 20B. FIG. 20A is a top view showing the configuration of the semiconductor package 500 from which the resin molding body 260 is excluded. One or more dies (semiconductor chips) may be contained in the resin molding body 260 of the semiconductor package 500 of the present disclosure. In this embodiment, as a semiconductor chip, one semiconductor device 100 is contained in the resin molding body 260. FIG. 20B is a sectional view taken along line B-B in FIG. 20A. The appearance of the resin molding body 260 is indicated by a broken line in FIG. 20A and a solid line in FIG. 20B. XY and YZ coordinate systems are shown in FIGS. 20A and 20B, respectively.

As shown in FIGS. 20A and 20B, the semiconductor package 500 of the present disclosure includes a die bonding pad (die pad) 270 on which the semiconductor device 100 according to any of the above-described embodiments is mounted. The die bonding pad 270 of this embodiment is made of a metal material and has a plate shape extending along the XY plane. The lead 266 extends in the negative direction of the Y-axis from one end of the die bonding pad 270. In the shown example, the lead 266 is connected to the die bonding pad 270 via a bended portion 270a. The die bonding pad 270 and the lead 266 form a lead frame, along with the leads 264 and 268 to be described later. The lead frame may be made of a copper alloyed or iron alloyed material. The lead frame may be formed by pressing or etching a plate made of a material having high mechanical strength, electrical conductivity, thermal conductivity and corrosion resistance.

The rear surface of the semiconductor device 100 is connected to the upper surface of the die bonding pad 270 via a solder layer or a conductive adhesive layer. For example, the drain electrode 12 shown in FIG. 8 exists in the bottom (a surface facing the negative direction of the Z-axis) of the semiconductor device 100. Therefore, the die bonding pad 270 is in electrical contact with the drain electrode of the semiconductor device 100. The lead 266 extending from the die bonding pad 270 acts as a drain terminal.

A first pad electrode 132 and a second pad electrode 142 are formed on the upper surface (a surface facing the positive direction of the Z-axis) of the semiconductor device 100. The first pad electrode 132 is in electrical contact with, e.g., the gate electrode 42 of the semiconductor device 100 shown in FIG. 8. The second pad electrode 142 is connected to, e.g., the source electrode 32 of the semiconductor device 100 shown in FIG. 8. The source electrode 32 extends to cover an active region in the semiconductor device 100 where a plurality of cells is arranged. The second pad electrode 142 may be the source electrode 32 itself or may be one or more metal pads disposed on the source electrode 32.

In the shown example, the first pad electrode 132 is connected to a bonding pad 264a located at one end of the lead 264 by a wire 272. The second pad electrode 142 is connected to a bonding pad 268a located at one end of the lead 268 by a wire 274. The wires 272 and 274 may be formed from a metal line such as, e.g., aluminum (Al) or the like. The wires 272 and 274, the pad electrodes 132 and 142 and the bonding pads 264a and 268a may be bonded, e.g., by ultrasonic welding. Electrical connection between electrodes (the gate electrode and the source electrode) in the upper surface of the semiconductor device 100 and the leads 264 and 268 may be made by a metal ribbon or clip instead of a metal wire.

The die bonding pad 270 and the leads 264, 266 and 268 are typically formed by machining one sheet of metal plate. A heat radiation member 280 is disposed on the bottom (rear side) of the die bonding pad 270 of this embodiment. The die bonding pad 270 and the heat radiation member 280 may be bonded together, e.g., by ultrasonic welding. The heat radiation member 280 may be made of a material having high thermal conductivity so as to dissipate heat generated in the semiconductor device 100 to the outside of the semiconductor package 500. The heat radiation member 280 may be made of a material having thermal conductivity higher than that of the resin molding body 260, for example, metal such as aluminum, copper, iron or the like. The heat radiation member 280 may be made of a metal material having thermal conductivity higher than that of the die bonding pad 270.

The resin molding body 260 may be formed after bonding the semiconductor device 100 on the die bonding pad 270 and completing a process of bonding the wires 272 and 274. The resin molding body 260 is made of, e.g., synthetic resin (plastics) such as epoxy resin or the like. The resin molding body 260 seals the die bonding pad 270 on which the semiconductor device 100 is mounted and the wires 272 and 274 from the surroundings. The resin molding body 260 covers portions (the bonding pads 264a and 268a), which are close to the die bonding pad 270, of the leads 264, 266 and 268. The leads 264, 266 and 268 project from the resin molding body 260 and extend in parallel to each other. The surfaces of the leads 264, 266 and 268 are typically coated with a plating layer.

In the example shown in FIG. 20B, the entire heat radiation member 280 is fully filled in the resin molding body 260. However, when the heat radiation member 280 is made of an insulating material, the heat radiation member 280 may be partially or entirely exposed to the outside of the resin molding body 260. The heat radiation member 280 may be made of an insulating material such as alumina, zirconia, aluminum nitride or the like.

The semiconductor package 500 of this embodiment is just one non-limitative illustrative example of the semiconductor package of the present disclosure. A plurality of semiconductor chips may be mounted within one resin molding body 260. For example, both of a high side MOSFET and a low side MOSFET of a half bridge in an inverter circuit may be mounted within one semiconductor package. In addition, the semiconductor package of the present disclosure may contain semiconductor elements or circuits (e.g., protective circuits) other than the semiconductor device of the present disclosure.

In addition, the number of leads may be varied depending on the number of semiconductor devices in the semiconductor package and the leads are not limited to a linear shape but may have a bent shape.

<Inverter>

Figure 21:
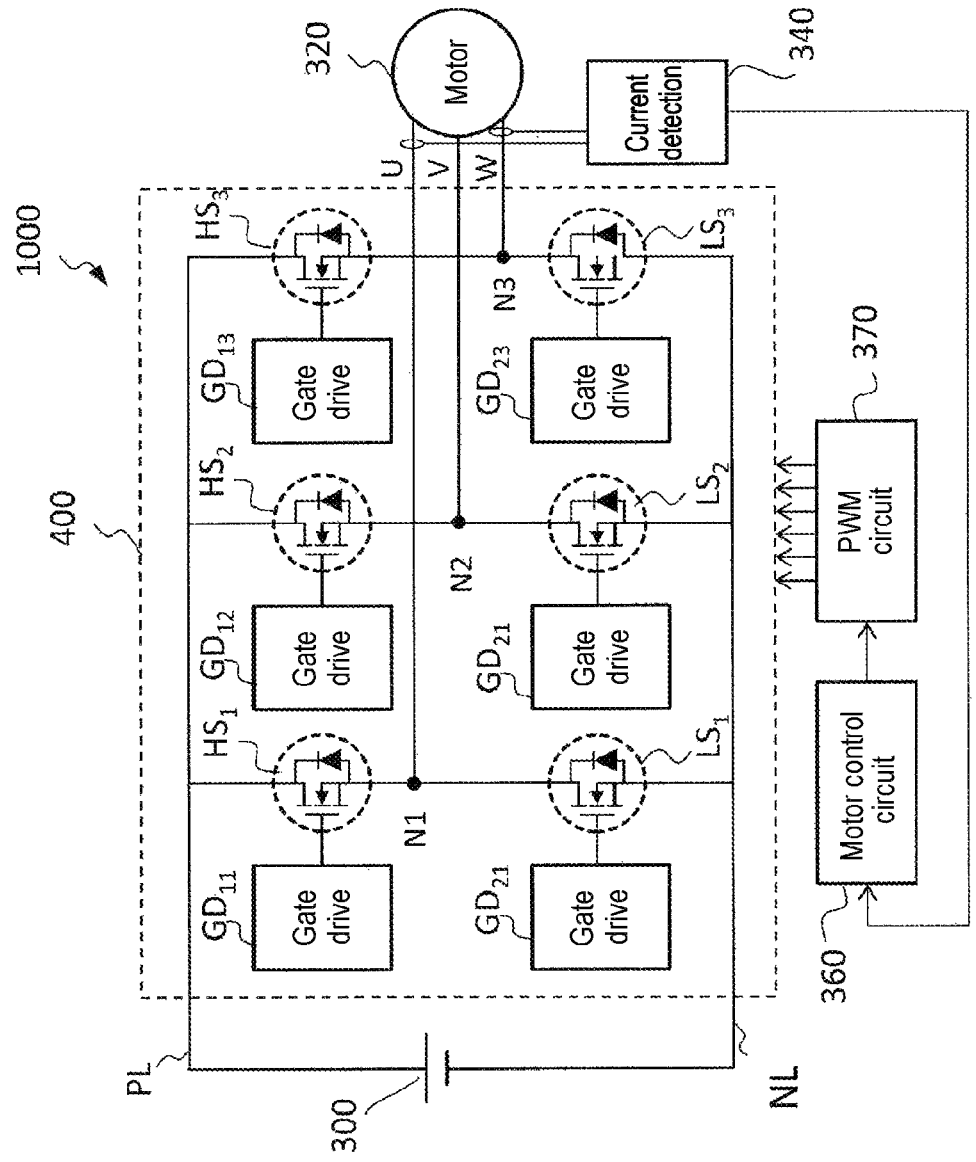
FIG. 21 is a block diagram showing an embodiment of an inverter in which the semiconductor device 100 of the present disclosure can be used.

FIG. 21 is a block diagram showing an embodiment of an inverter in which the semiconductor device 100 of the present disclosure can be used.

An inverter 1000 of FIG. 21 includes a DC power supply 300, a three-phase inverter circuit 400 to perform a drive control of a three-phase synchronous motor 320, a current sensor 340, a motor control circuit 360 and a PWM circuit 370.

The DC power supply 300 may include a converter circuit (not shown) which is connected to, e.g., a commercial power system and converts an AC voltage to a DC voltage. The inverter circuit 400 converts DC power to AC power and drives the motor 320 with the AC power. Based on a PWM signal output from the PWM circuit 370, the inverter circuit 400 converts DC power, which is supplied from the DC power supply 300, to three-phase AC power, which is a pseudo sinusoidal wave of U-phase/V-phase/W-phase, and drives the three-phase synchronous motor 320 with the three-phase AC power.

The inverter circuit 400 includes switching elements $HS_1$, $HS_2$, $HS_3$, $LS_1$, $LS_2$ and $LS_3$ implemented by the semiconductor device 100 according to the above-described embodiments of the present disclosure. These switching elements $HS_1$, $HS_2$, $HS_3$, $LS_1$, $LS_2$ and $LS_3$ form a three-phase bridge circuit and their gate electrodes are connected to gate drive circuits $GD_{11}$, $GD_{12}$, $GD_{13}$, $GD_{21}$, $GD_{22}$ and $GD_{23}$, respectively. More specifically, the switching elements $HS_1$ and $LS_1$ are connected in series between a DC bus PL connected to the positive electrode of the DC power supply 300 and a DC bus NL connected to the negative electrode of the DC power supply 300 via a first node N1. The first node N1 is connected to a U-phase power line of the motor 320. The switching elements $HS_2$ and $LS_2$ are connected in series between the DC bus PL and the DC bus NL via a second node N2. The second node N2 is connected to a V-phase power line of the motor 320. The switching elements $HS_3$ and $LS_3$ are connected in series between the DC bus PL and the DC bus NL via a third node N3. The third node N3 is connected to a W-phase power line of the motor 320.

The current sensor 340 detects a value of current flowing through the U-, V- and W-phase power lines and provides the detected current value to the motor control circuit 360.

The motor control circuit 360 estimates a motor torque based on the current value for each phase detected by the current sensor 340, and inputs a three-phase AC voltage command value, which is determined to implement a required motor torque, to the PWM circuit 370. The motor control circuit 360 may have a typical configuration including a central processing unit (CPU), a read only memory (ROM) and a random access memory (RAM), which are connected to a bus. The CPU reads a program stored in the ROM, loads the read program into the RAM, and performs an operation of the motor control circuit 360.

The PWM circuit 370 receives a signal from the motor control circuit 360 and generates a PWM signal. More specifically, the PWM circuit 370 generates the PWM signal according to the three-phase AC command value obtained from the motor control circuit 360 and a value of amplitude of a predetermined sinusoidal wave voltage, and inputs the generated PWM signal to each of the gate drive circuits $GD_{11}$, $GD_{12}$, $GD_{13}$, $GD_{21}$, $GD_{22}$ and $GD_{23}$ of the inverter circuit 400.

In response to the PWM signal from the PWM circuit 370, the gate drive circuits $GD_{11}$, $GD_{12}$, $GD_{13}$, $GD_{21}$, $GD_{22}$ and $GD_{23}$ control the corresponding switching elements $HS_1$, $HS_2$, $HS_3$, $LS_1$, $LS_2$ and $LS_3$ to perform a switching operation of turning-on/off. The gate drive circuits $GD_{11}$, $GD_{12}$, $GD_{13}$, $GD_{21}$, $GD_{22}$ and $GD_{23}$ may be integrated onto one or more IC chips acting as a gate driver. Typically, high side and low side may use different gate drivers. Such one or more IC chips may be mounted within the same package or on the same substrate, along with one or more IC chips to implement the motor control circuit 360 and the PWM circuit 370, or alternatively, may be mounted within a separate package or on a separate substrate, separately from these IC chips.

With the inverter of this embodiment, since no self-turn-on effect of SJ-MOSFET occurs when a motor is driven, it is possible to realize an electronic apparatus with high energy efficiency and reliability. In particular, when the inverter is used in equipment such as an air conditioner with a motor as a load, it is possible to reduce a loss which occurs not only in a high power load operation such as a start-up or the like but also in a low power load operation in the stationary conditions, contributing to increase in an annual performance factor (APF).

The inverter of the present disclosure is not limited to the above-described configurations but may employ any other configurations.

INDUSTRIAL APPLICABILITY

The semiconductor device of the present disclosure can be used in an inverter for driving an inductive load such as a motor or the like. The inverter of the present disclosure can be used in various kinds of electronic apparatuses such as air conditioners and the like.

In the semiconductor device of the present disclosure, a value of gate-drain capacitance $C_{gd}$ is not simply set to be small. Rather than, a value of gate-source capacitance $C_{gs}$ and a value of gate-drain capacitance $C_{gd}$ at a certain range of drain-source voltage are adjusted to have a proper relationship. Therefore, it is possible to prevent a self-turn-on effect from occurring when the semiconductor device of the present disclosure is used in an inverter for driving an inductive load such as a motor or the like. The semiconductor device of the present disclosure can provide an inverter with a reduced loss in a low voltage/constant current mode and increase energy use efficiency of electronic apparatuses such as air conditioners, as compared to a case where IGBT is used.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:
a first conductivity type drain layer;
a first conductivity type drift layer on the first conductivity type drain layer;
a plurality of second conductivity type base regions located in an upper surface of the drift layer;
a first conductivity type source region which is disposed inside each of the plurality of second conductivity type base regions and is spaced apart from a periphery of each of the plurality of second conductivity type base regions, wherein a channel region is formed between the first conductivity type source region and the periphery of each of the plurality of second conductivity type base regions;
a gate insulating layer covering the channel region;
a gate electrode which is located on the gate insulating layer and faces the channel region;
a plurality of second conductivity type column regions, each extending from the plurality of second conductivity type base regions to the first conductivity type drain layer in the first conductivity type drift layer;
a trap level forming region in the first conductivity type drift layer;
a drain electrode electrically connected to the first conductivity type drain layer; and
a source electrode electrically connected to the first conductivity type source region;
wherein, when a drain-source voltage is $V_{DS}$, a gate-source capacitance is $C_{gs}$, and a gate-drain capacitance is $C_{gd}$, a value of $(C_{gs}+C_{gd})/C_{gd}$ at $Y_{DS}$ of 5 volts is equal to or more than 4 and equal to or less than 30.

2. The semiconductor device of claim 1, further comprising: a first conductivity type impurity additional doping layer located in the upper surface of the first conductivity type drift layer.

3. The semiconductor device of claim 2, wherein a dose of implantation of first conductivity type impurity ions in the impurity additional doping layer is equal to or more than $1.0\times10^{12}/cm^2$ and equal to or less than $2.0\times10^{12}/cm^2$.

4. The semiconductor device of claim 1, wherein a minimum dimension of the gate electrode is equal to or more than 8 μm and equal to or less than 10 μm.

5. The semiconductor device of claim 4, wherein a space between two adjacent base regions of the plurality of second conductivity type base regions in the upper surface of the first conductivity type drift layer is equal to or more than 1 μm and equal to or less than 2 μm.

6. The semiconductor device of claim 5, wherein a value of $(C_{gs}+C_{gd})/C_{gd}$ at $V_{DS}$ of 5 volts is equal to or more than 5 and equal to or less than 30.

7. The semiconductor device of claim 1, wherein a reverse recovery time of a body diode in the semiconductor device is equal to or less than 150 nano seconds.

8. The semiconductor device of claim 1, wherein the plurality of second conductivity type base regions and the plurality of second conductivity type column regions are arranged in a stripe shape.

9. The semiconductor device of claim 1, further comprising:
an interlayer insulating film which electrically isolates the gate electrode and the source electrode from each other and has an opening which contacts the source electrode to each of the plurality of first conductivity type source regions;
a first pad electrode disposed on the interlayer insulating film and electrically connected to the gate electrode; and
a second pad electrode electrically connected to the source electrode.

10. A semiconductor package comprising:
one or more semiconductor chips;
a resin molding body containing the one or more semiconductor chips,
wherein at least one of the one or more semiconductor chips is the semiconductor device of claim 9,
the semiconductor package further comprising:
a first lead electrically connected to the first pad electrode;
a second lead electrically connected to the second pad electrode; and
a die bonding pad electrically connected to the drain electrode and having one end from which a third lead extends,
wherein a portion of each of the first, second and third leads projects from the resin molding body.

11. The semiconductor package of claim 10, wherein the first pad electrode and the second pad electrode are connected to the first lead and the second lead by wire bondings, respectively, and
wherein the drain electrode is connected to the die bonding pad by a conductive adhesive layer.

12. An inverter comprising:
a bridge circuit formed by a plurality of switching elements, each containing a body diode; and
a gate drive circuit configured to drive the plurality of switching elements,
wherein each of the plurality of switching elements is the semiconductor device of claim 1.

13. The inverter of claim 12, wherein one of the source electrode and the drain electrode of the semiconductor device is connected to an inductive load.

14. An electronic apparatus comprising:
an inverter including a bridge circuit formed by a plurality of switching elements, each containing a body diode; and
a motor connected to the inverter,
wherein at least one of the plurality of switching elements is the semiconductor device of claim 1.

* * * * *